United States Patent
Tanabe et al.

(10) Patent No.: US 10,522,957 B2
(45) Date of Patent: Dec. 31, 2019

(54) POWER CONVERTER

(71) Applicant: DENSO CORPORATION, Kariya, Aichi-pref. (JP)

(72) Inventors: Ryota Tanabe, Kariya (JP); Akihumi Kurita, Kariya (JP); Yohei Yoshimura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/039,587

(22) Filed: Jul. 19, 2018

(65) Prior Publication Data
US 2019/0036282 A1 Jan. 31, 2019

(30) Foreign Application Priority Data
Jul. 25, 2017 (JP) .................. 2017-143934

(51) Int. Cl.
| H05K 7/00 | (2006.01) |
| H01R 25/16 | (2006.01) |
| H01L 23/50 | (2006.01) |
| H02M 7/00 | (2006.01) |

(52) U.S. Cl.
CPC .......... *H01R 25/162* (2013.01); *H01L 23/50* (2013.01); *H02M 7/003* (2013.01); *H05K 7/00* (2013.01)

(58) Field of Classification Search
None
See application file for complete search history.

(56) References Cited

U.S. PATENT DOCUMENTS

| 7,847,201 B2 * | 12/2010 | Fukumoto | H05K 5/0052 174/545 |
| 9,633,926 B2 * | 4/2017 | Takano | H01L 23/473 |
| 2010/0327949 A1 * | 12/2010 | Gotou | H01L 25/115 327/487 |
| 2011/0127061 A1 * | 6/2011 | Gotou | H02M 7/003 174/68.2 |
| 2011/0261600 A1 * | 10/2011 | Tachibana | H02M 7/003 363/131 |
| 2014/0153189 A1 | 6/2014 | Okamura | |
| 2014/0185266 A1 * | 7/2014 | Iwata | H02M 7/003 361/820 |
| 2018/0342959 A1 * | 11/2018 | Hirasawa | H02M 7/003 |

FOREIGN PATENT DOCUMENTS

| JP | 2011-088406 A | 5/2011 |
| JP | 2014-171342 A | 9/2014 |

* cited by examiner

*Primary Examiner* — Courtney L Smith
*Assistant Examiner* — Rashen E Morrison
(74) *Attorney, Agent, or Firm* — Oliff PLC

(57) ABSTRACT

In a power converter, a semiconductor module incorporates therein a semiconductor element that constitutes a power converter circuit. The semiconductor module has a power terminal extending therefrom, and the power terminal has opposing first and second terminal surfaces. The power converter includes a capacitor electrically connected to the semiconductor module. The power converter includes a busbar. The busbar includes a capacitor-connection terminal connected to the capacitor, and at least first and second semiconductor-connection terminals that are at least partly joined to the respective first and second terminal surfaces of the power terminal.

15 Claims, 19 Drawing Sheets

POWER CONVERTER

CROSS REFERENCE TO RELATED APPLICATION

This application is based on and claims the benefit of priority from Japanese Patent Application No. 2017-143934 filed on Jul. 25, 2017, the disclosure of which is incorporated in its entirety herein by reference.

TECHNICAL FIELD

The present disclosure relates to power converters.

BACKGROUND

Power converters convert direct-current (DC) power into alternating-current (AC) power, AC power into DC power, and/or a level of DC power into another level. A typical example of these power converters, which is disclosed in Japanese Patent Application Publication No. 2014-110400, includes semiconductor modules, a capacitor, and a pair of positive and negative busbars that electrically connect the semiconductor modules and the capacitor with each other. Specifically, each of the semiconductor modules includes power terminals. Each of the power terminals has opposing first and second surfaces. Each of the busbars includes connectors. The connectors of the one of the busbars are respective joined to the first surfaces of the corresponding power terminals of each semiconductor module, and the connectors of the other of the busbars are also joined to the first surfaces of the corresponding power terminals of each semiconductor module.

SUMMARY

A typical example of the joining process is to weld the first surface of each of the power terminals to the connector of the corresponding one of the busbars. This welding needs to mount and hold the first surface of each of the power terminals on the connector of the corresponding one of the busbars.

Because the connector of each of the busbars is configured to be joined to only the first surface of the corresponding one of the power terminals, it may be difficult to mount and hold the first surface of each of the power terminals on the connector of the corresponding one of the busbars. There is therefore a room for further improvement of the productivity of such power converters.

Additionally, recent higher-current capacity power converters require lower-inductance busbars. Such a conventional power converter, in which the connector of each of the busbars is configured to be joined to only the first surface of the corresponding one of the power terminals, may limit the area of the current-flow path between the connector of each of the busbars and the first surface of the corresponding one of the power terminals. This may make it difficult to increase the area of the current-flow path between the connector of each of the busbars and the first surface of the corresponding one of the power terminals, resulting in difficulty of obtaining reduction in the inductance of each busbar.

In view of the circumstances set forth above, an exemplary aspect of the present disclosure seeks to provide power converters, each of which is capable of featuring easier productivity and/or lower-inductance busbars.

According to a first exemplary aspect of the present disclosure, there is provided a power converter. The power converter includes a semiconductor module incorporating therein a semiconductor element constituting a power converter circuit. The semiconductor module has a power terminal extending therefrom, the power terminal having opposing first and second terminal surfaces. The power converter includes a capacitor electrically connected to the semiconductor module, and a busbar.

The busbar includes a capacitor-connection terminal connected to the capacitor. The busbar includes at least first and second semiconductor-connection terminals that are at least partly joined to the respective first and second terminal surfaces of the power terminal.

According to a second exemplary aspect of the present disclosure, there is provided a power converter. The power converter includes a semiconductor module incorporating therein a semiconductor element constituting a power converter circuit. The semiconductor module has a power terminal extending therefrom, and the power terminal has opposing first and second terminal surfaces. The power converter includes a busbar including a slit defined therethrough such that the power terminal is located in the slit, and at least first and second semiconductor-connection terminals that are at least partly joined to the respective first and second terminal surfaces of the power terminal located in the slit.

The power converter according to each of the first and second exemplary aspects is configured such that the first and second terminal surfaces of the power terminal are at least partly joined to the respective first and second semiconductor-connection terminals of the busbar. This configuration enables the power terminal to be easily located to the first and second semiconductor-connection terminals of the busbar. Specifically, arranging the power terminal while the first and second terminal surfaces are abutted onto the respective first and second semiconductor-connection terminals of the busbar enables alignment between the power terminal and the semiconductor-connection terminals of the busbar to be easily carried out.

This therefore makes it possible to join the first and second terminal surfaces of the power terminal to the respective first and second semiconductor-connection terminals of the busbar, resulting in improvement of productivity of the power converter.

Additionally, the busbar is joined to both the first and second terminal surfaces of the power terminal. For this reason, current-flow paths from the busbar to the power terminal are provided through both the first terminal surface and the second terminal surface of the power terminal. Similarly, current-flow paths to the busbar from the power terminal are provided through both the first terminal surface and the second terminal surface of the power terminal.

That is, this configuration of the power converter makes it possible to allocate, for the power terminal, two current-flow paths via the respective first and second terminal surfaces. This therefore makes it possible to increase the total area of the current-flow paths between the busbar and the power terminal, resulting in the busbar having lower inductance.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

The following describes exemplary embodiments of the present disclosure with reference to the accompanying drawings.

First Embodiment

The following describes a power converter 1 according to the first embodiment with reference to FIGS. 1 to 13.

Figure 1:
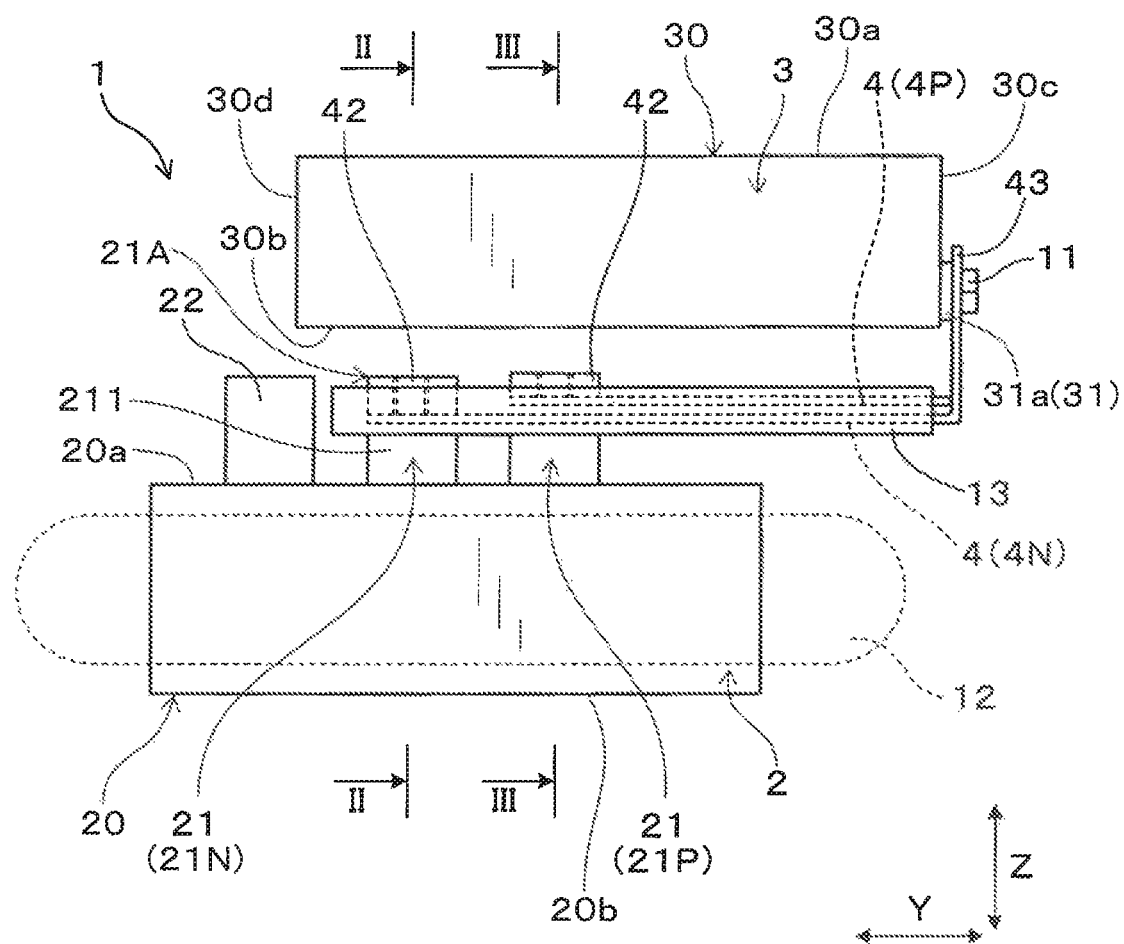
FIG. 1 is a structural view of a power converter according to the first embodiment of the present disclosure.
Figure 2:
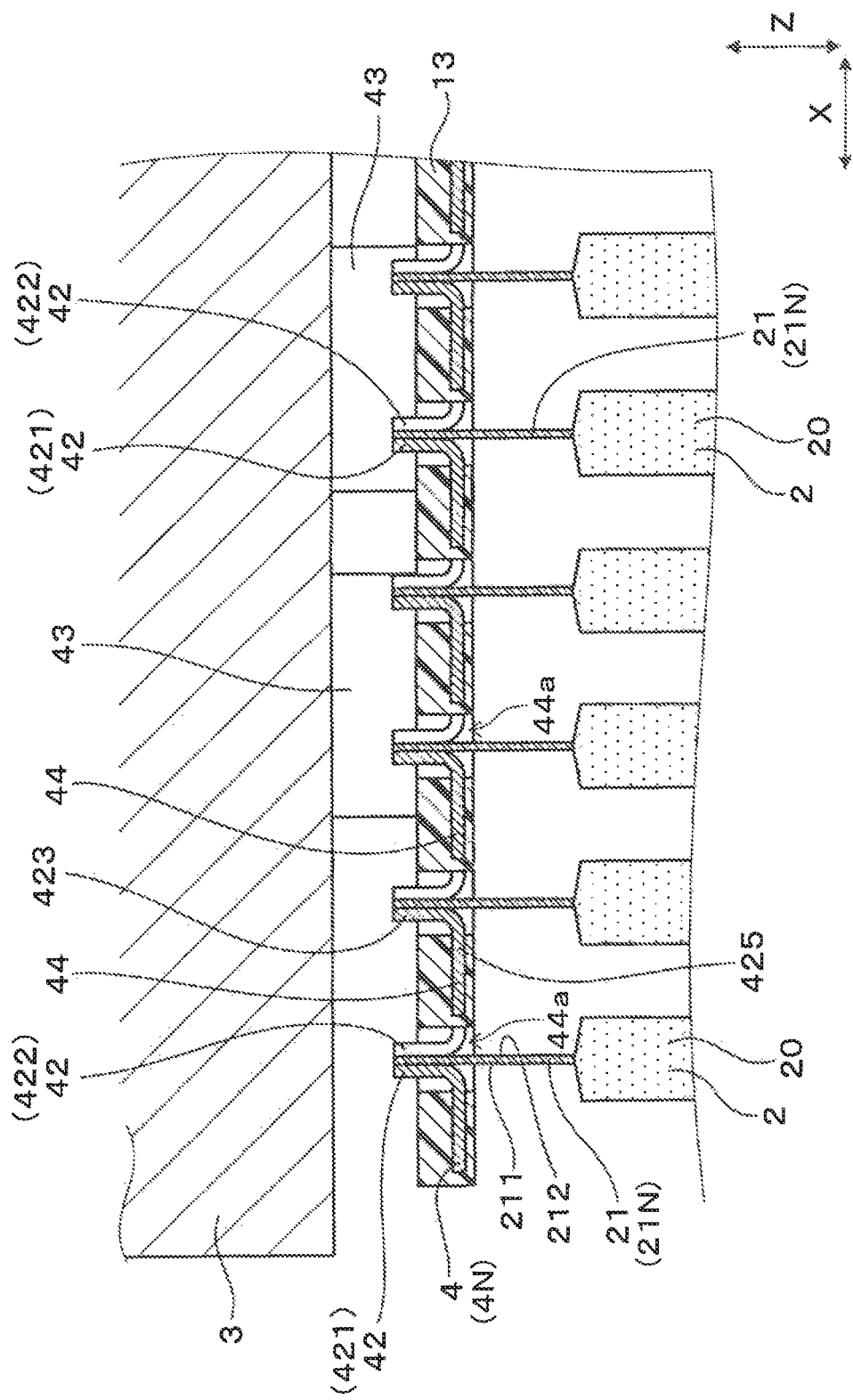
FIG. 2 is a partially cross-sectional view taken along line II-II of FIG. 1.
Figure 3:
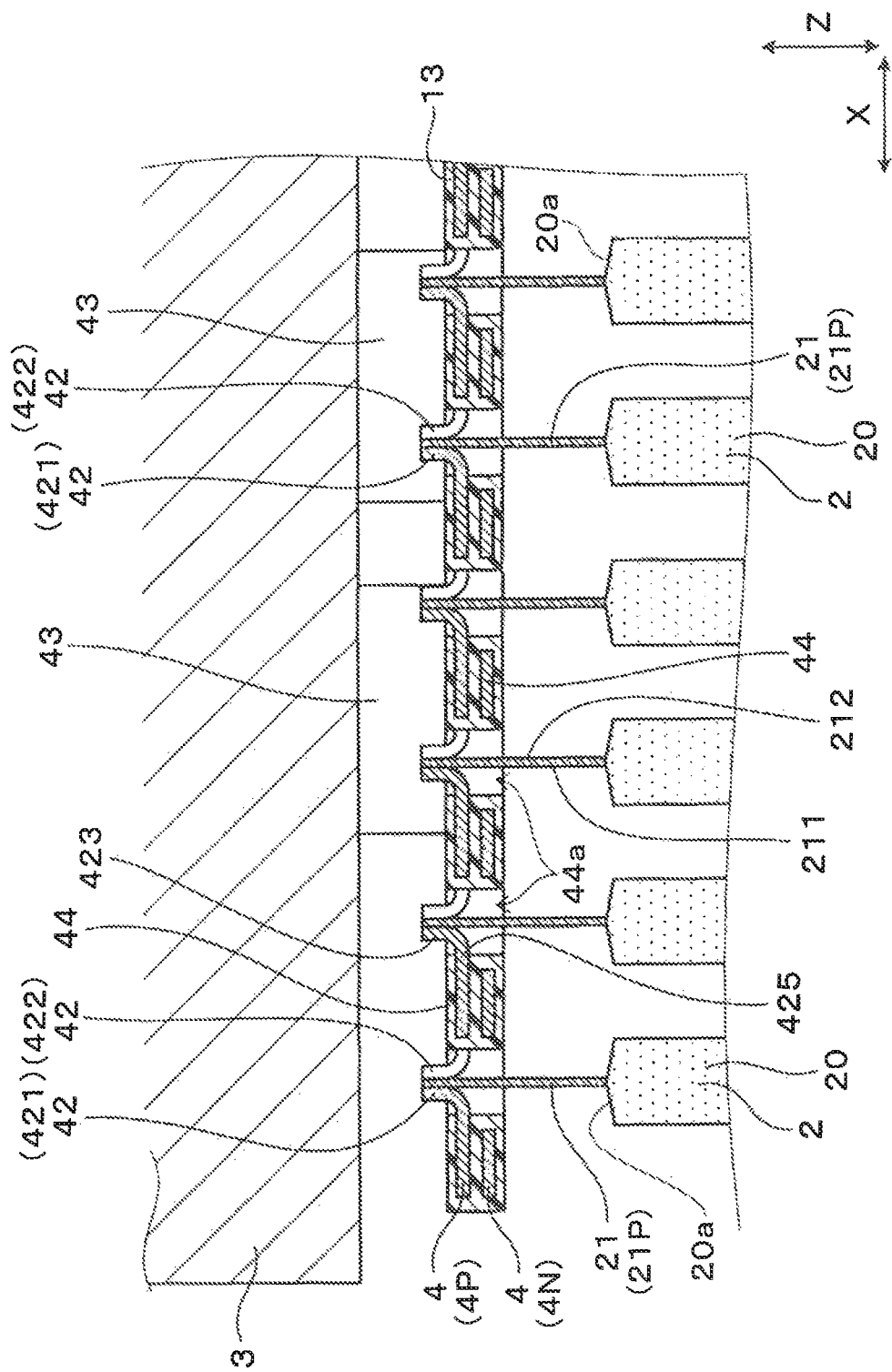
FIG. 3 is a partially cross-sectional view taken along line III-III of FIG. 1.

Referring to for example FIGS. 1 to 3, the power converter 1 includes semiconductor modules 2, a capacitor module 3 including common positive and negative electrodes 31, and a pair of DC busbars 4 (4P, 4N).

Each of the semiconductor modules 2 incorporates therein semiconductor elements 20, such as insulated gate bipolar transistors (IGBTs) or metal-oxide semiconductor field-effect transistors (MOSFETs) 20, constituting a power converter circuit for converting DC power into AC power, AC power into DC power, and/or a level of DC power into another level.

Each of the semiconductor modules 2 includes a semiconductor package, i.e. a semiconductor body, 20 having a rectangular-parallelepiped shape. The semiconductor package 20 has opposing first and second side surfaces 20a and 20b in a vertical direction corresponding to a Z direction in FIG. 1.

Each of the semiconductor modules 20 includes three plate-like terminals 21, 22 extending outwardly in the same Z direction from the first surface 20a of the semiconductor package 20 with spaces therebetween; the three plate-like terminals 21, 22 include two plate-like positive and negative power terminals 21P and 21N and one plate-like output terminal 22. The positive and negative power terminals 21P and 21N are separately arranged to be adjacent to each other in a Y direction perpendicular to the Z direction (see FIG. 1). Note that each of the semiconductor modules 2 includes unillustrated control terminals, such as gate terminals, extending outwardly from the semiconductor package 20.

The DC busbars 4 include a positive busbar 4P and a negative busbar 4N. The positive power terminal 21P of each semiconductor module 2 and the common positive electrode 31 of the capacitor module 3 are electrically connected to each other with the positive busbar 4P, and the negative power terminal 21N of each semiconductor module 2 and the common negative electrode 31 of the capacitor module 3 are electrically connected to each other with the negative busbar 4N.

Figure 4:
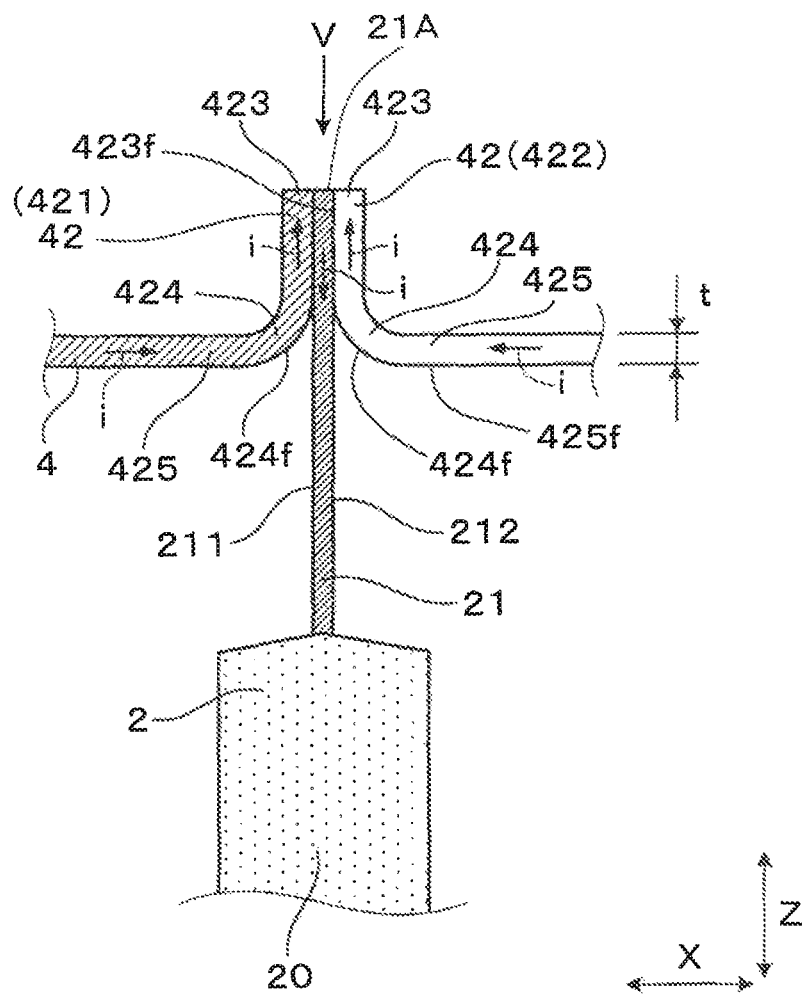
FIG. 4 is a partially cross-sectional view illustrating a joint portion between a common power terminal and semiconductor-connection terminals of the power converter illustrated in FIG. 1.

Referring to, for example, FIGS. 2 to 4, each of the power terminals 21 has opposing first and second major surfaces 211 and 212 in an X direction perpendicular to the Y and Z directions.

Figure 8:
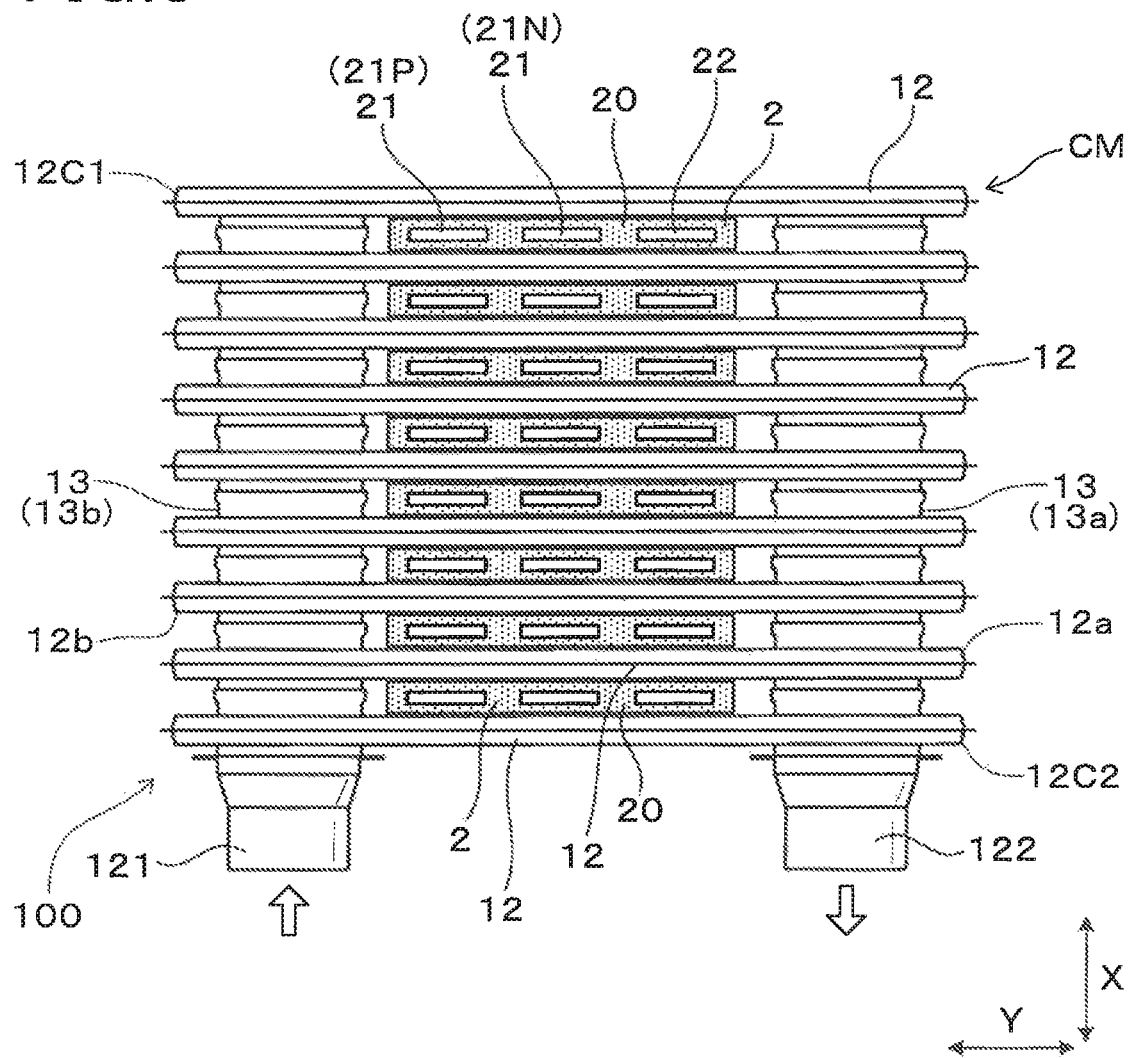
FIG. 8 is a plan view of the power converter from which the busbars have been removed according to the first embodiment.
Figure 9:
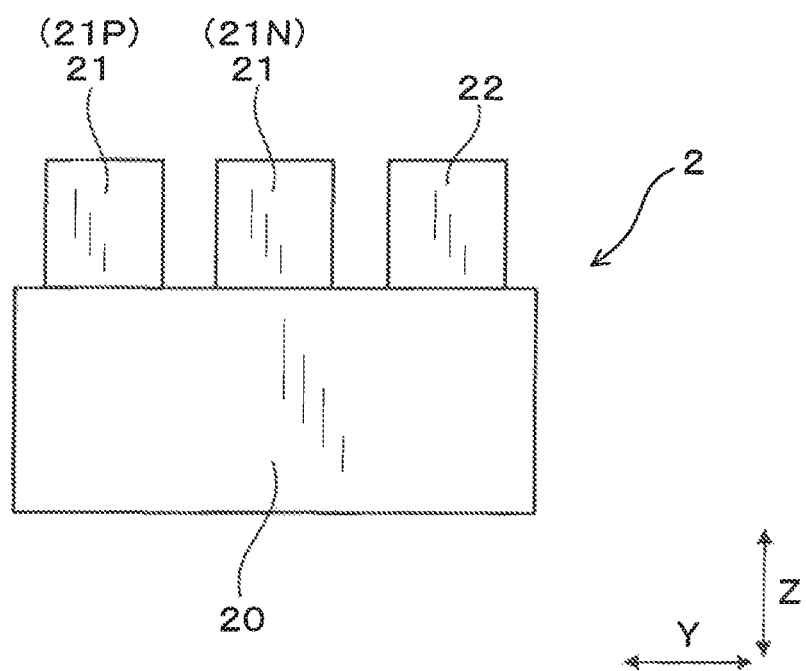
FIG. 9 is an elevational view of a semiconductor module according to the first embodiment.

Referring to, for example, FIGS. 2, 3, and 8, the semiconductor modules 2 are arranged, i.e. stacked, in the normal direction, which corresponds to the X direction, to the first and second major surfaces 211 and 212 with, for example, regular intervals thereamong. In particular, the terminals 21 and 22 are arranged such that the normal direction to the opposing first and second major surfaces 211 is directed to be parallel to the X direction.

That is, the X direction corresponds to the arrangement direction of the semiconductor modules 2, and the adjacent direction of the positive and negative power terminals 21P and 21N corresponds to the Y direction, and the extending direction of the positive and negative power terminals 21P and 21N corresponds to the Z direction.

The power converter 1 includes a cooling mechanism CM for cooling the semiconductor modules 2. The cooling mechanism CM includes cooling pipes 12 and joint pipes 13 for communicably connecting the cooling pipes 12. Each of the cooling pipes 12 has a substantially rectangular plate-like shape, and has a longitudinal length in the Y direction longer than the longitudinal length of each semiconductor module 2 in the Y direction.

Referring to, for example, FIG. 8, the semiconductor modules 2 and the cooling pipes 12 are alternately arranged in the X direction to constitute a semiconductor-module assembly 100, i.e. a semiconductor-module stack 100, such that two cooling pipes 12C1 and 12C2 are located at both ends of the semiconductor-module assembly 100 in the X direction.

Each of the cooling pipes 12 has opposing first and second ends 12a and 12b in its longitudinal direction, i.e. the Y direction. The joint pipes 13 include a first joint pipe 13a communicably connecting the first ends 12a of the cooling pipes 12, and a second joint pipe 13b communicably connecting the second ends 12b of the cooling pipes 12.

Referring to FIG. 8, the power converter 1 includes an introduction pipe 121 and an exhaust pipe 122. The cooling pipe 12C2 has opposing first and second ends. The introduction pipe 16 is communicably connected to the first end of the cooling pipe 12C2 of the cooling mechanism CM. The exhaust pipe 122 is communicably connected to the second end 12b of the cooling pipe 12C2 of the cooling mechanism CM. When a predetermined refrigerant is introduced into the introduction pipe 16, the refrigerant flows into all the cooling pipes 12 from their second ends 12b via the second joint pipes 13b, and reaches the first ends 12a of all the cooling pipes 12. Thereafter, the refrigerant flows through the first joint pipes 13a to be exhausted from the exhaust pipe 122. That is, introduction of the refrigerant into the cooling pipes 12 and exhaust of the refrigerant from the cooling pipes 12 are repeatedly carried out, resulting in cooling of the semiconductor modules 2.

For example, the capacitor module 3 is comprised of a substantially rectangular-parallelepiped case 30, a plurality of capacitor cells (not shown) installed in the case 30, and the positive and negative electrodes 31.

The case 30 has opposing first and second side surfaces 30a and 30b in the Z direction, and is arranged such that the second side surface 30b faces the first side surface 20a of the package 20 of each semiconductor module 2. The case 30 also has third and fourth side surfaces 30c and 30d in the Y direction.

The capacitor module 3 is also comprised of the common positive and negative electrodes 31 set forth above. The common positive electrode 31 is joined to a first end of each capacitor cell, and the common negative electrode 31 is also joined to an opposing second end of each capacitor cell. One end 31a, which will be referred to as a connector end, of each of the common positive and negative electrodes 31 is airtightly penetrated through the first side surface 30c of the case 30 so as to be exposed from the case 30. The connector ends 31a are aligned on the first side surface 30c in the X direction.

Figure 11:
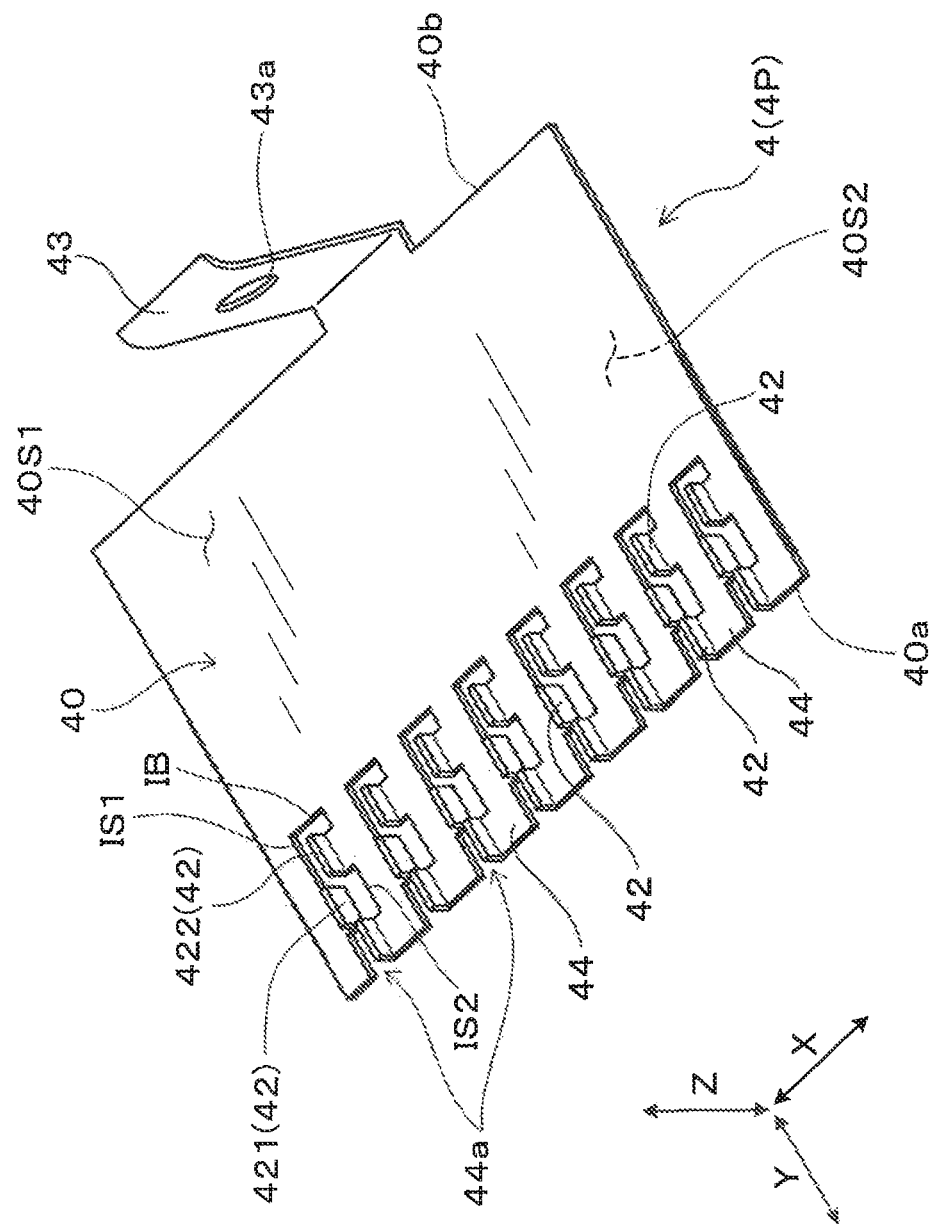
FIG. 11 is a perspective view illustrating the positive busbar according to the first embodiment.

Referring to FIG. 11, the positive busbar 4P is comprised of a substantially rectangular-parallelepiped plate-like body 40 having opposing first and second major surfaces 40S1 and 40S2 in the Z direction and opposing first and second ends 40a and 40b in the Y direction.

The positive busbar 4P is also comprised of slits 44a defined through the first end 40a of the body 40 and extending inwardly, resulting in separate members 44 adjacent to the slits 44a; each of the slits 44a has a predetermined longitudinal length and a predetermined width. As illustrated in, for example, FIG. 2, the slits 44a are arranged to face the respective first side surfaces 20a of the semiconductor bodies 20 of the respective semiconductor modules 2.

The positive busbar 4P is further comprised of plural sets of semiconductor-connection terminals 42 for the respective slits 44a. For example, three semiconductor-connection terminals 42 in each set are provided for the corresponding one of the slits 44a.

That is, each of the slits 44a is comprised of a pair of opposing first and second inner peripheral surfaces IS1 and IS2 and an inner bottom surface IB of the positive busbar 4P.

Figure 5:
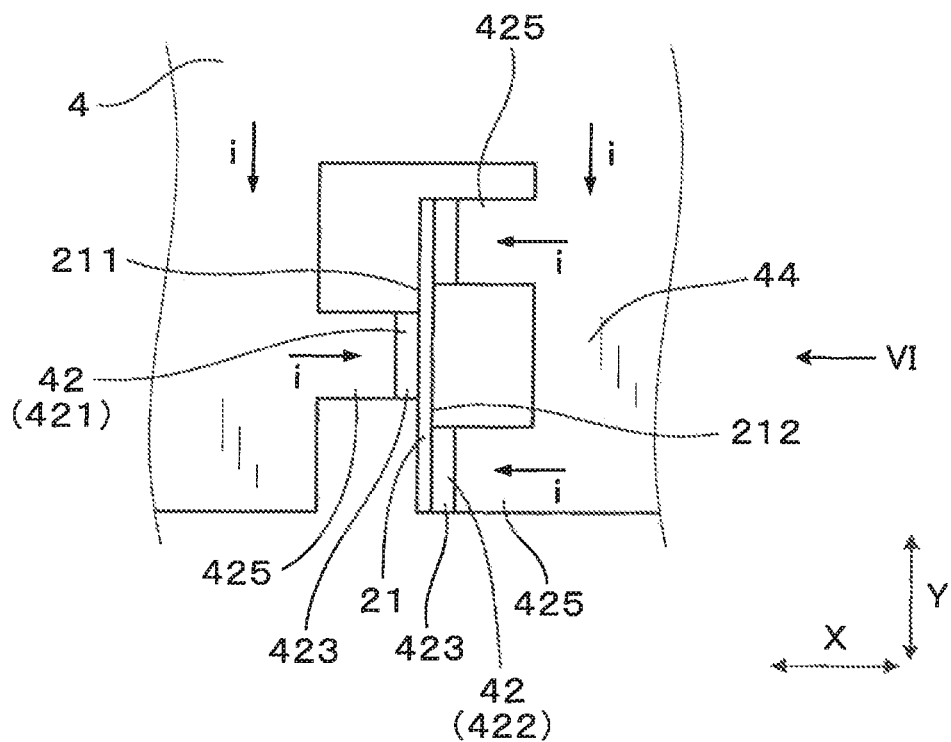
FIG. 5 is a perspective view of the joint portion when viewed from arrow V illustrated in FIG. 4.
Figure 6:
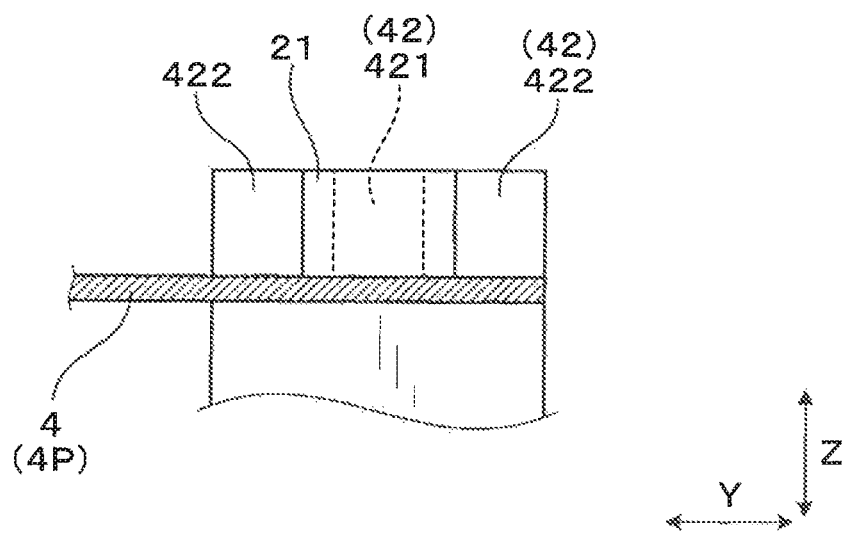
FIG. 6 is a perspective view of the joint portion when viewed from arrow VI illustrated in FIG. 5.
Figure 7:
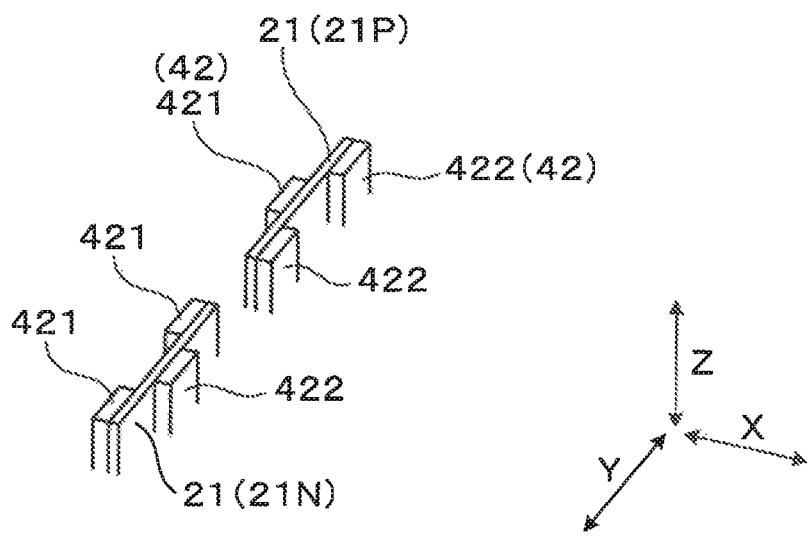
FIG. 7 is a perspective view of joint portions each between a common power terminal and positive and negative semiconductor-connection terminals of the power converter illustrated in FIG. 1.

Referring to FIGS. 5, 7, and 11, the semiconductor-connection terminals 42 for each set includes a first busbar terminal 421 and two second busbar terminals 422. The first busbar terminal 421 extends toward the capacitor module 3 from one of the first and second inner peripheral surfaces IS1 and IS2, and the second busbar terminals 422 extend toward the capacitor module 3 from the other of the first and second inner peripheral surfaces IS1 and IS2 such that the first busbar terminal 421 and the second busbar terminals 422 are non-overlapped with each other when the positive busbar 4P is viewed in the X direction.

For example, the second busbar terminals 422 are provided on the second inner peripheral surface IS2 to have a space therebetween, and the first busbar terminal 421 is provided on the first inner peripheral surface IS1 to face the space between the second busbar terminals 422.

Additionally, the positive busbar 4P is comprised of a capacitor-connection terminal 43 attached to a predetermined portion of the second end 40b of the body 40 to extend toward the capacitor module 3 in the Z direction.

Figure 12:
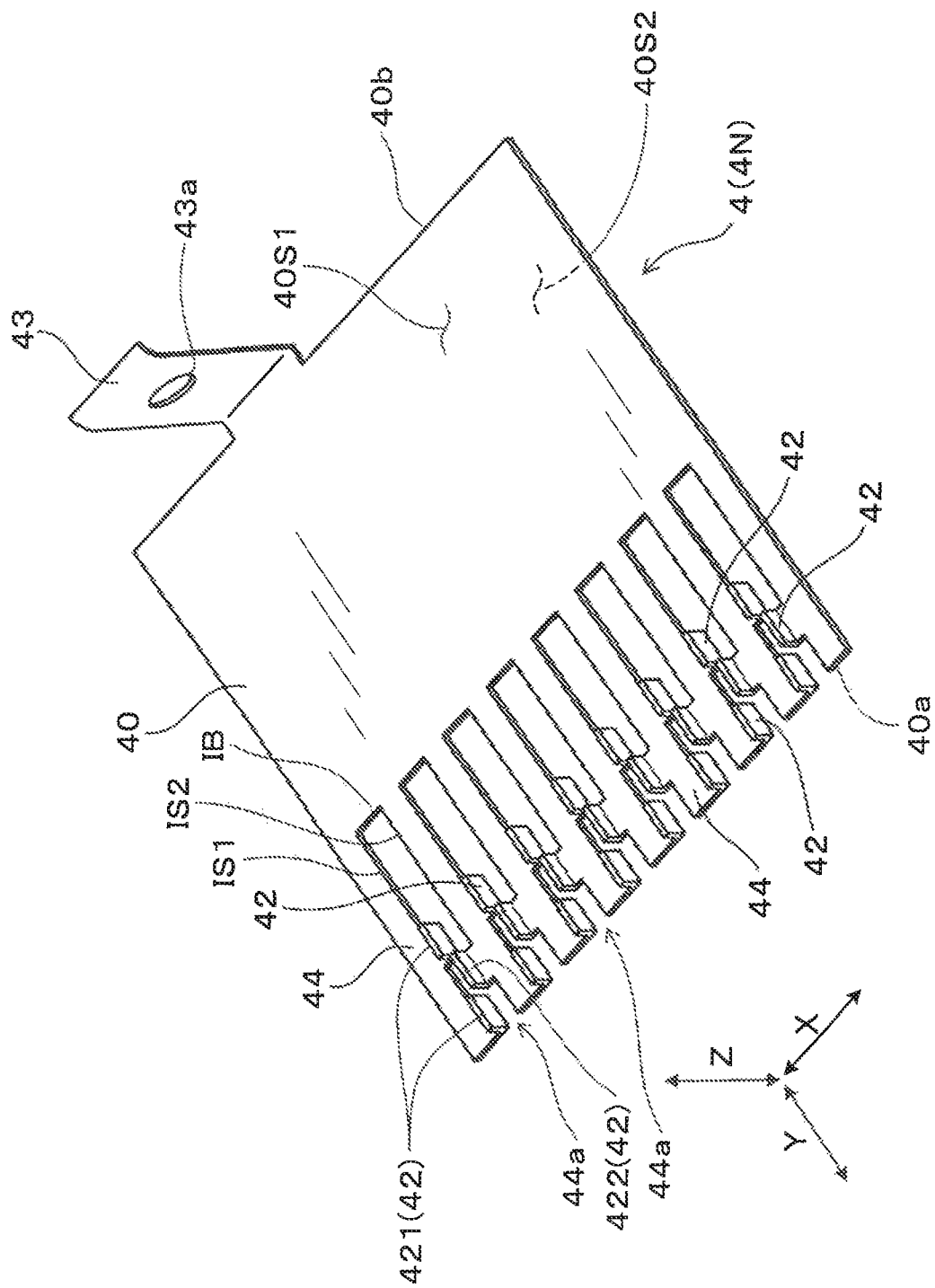
FIG. 12 is a perspective view illustrating the negative busbar according to the first embodiment.
Figure 13:
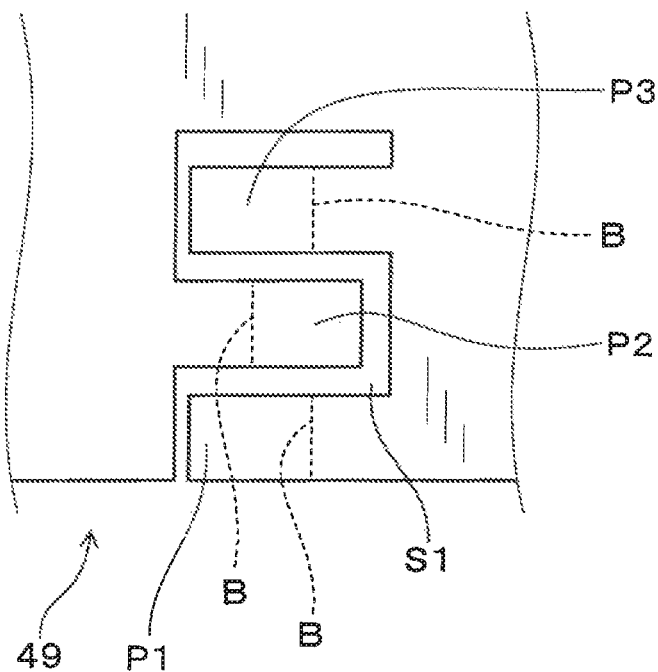
FIG. 13 is a plan view of a metal plate prepared for producing semiconductor-connection terminals according to an example of the first embodiment.
Figure 14:
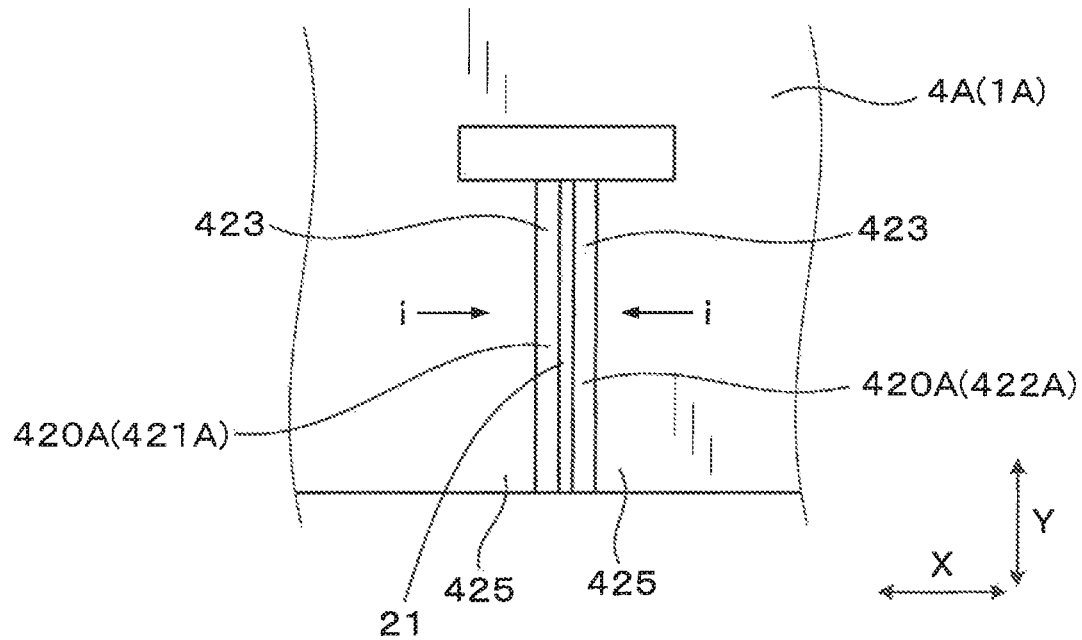
FIG. 14 is a plan view illustrating a joint portion between a common power terminal and semiconductor-connection terminals of a power converter according to the second embodiment of the present disclosure.
Figure 15:
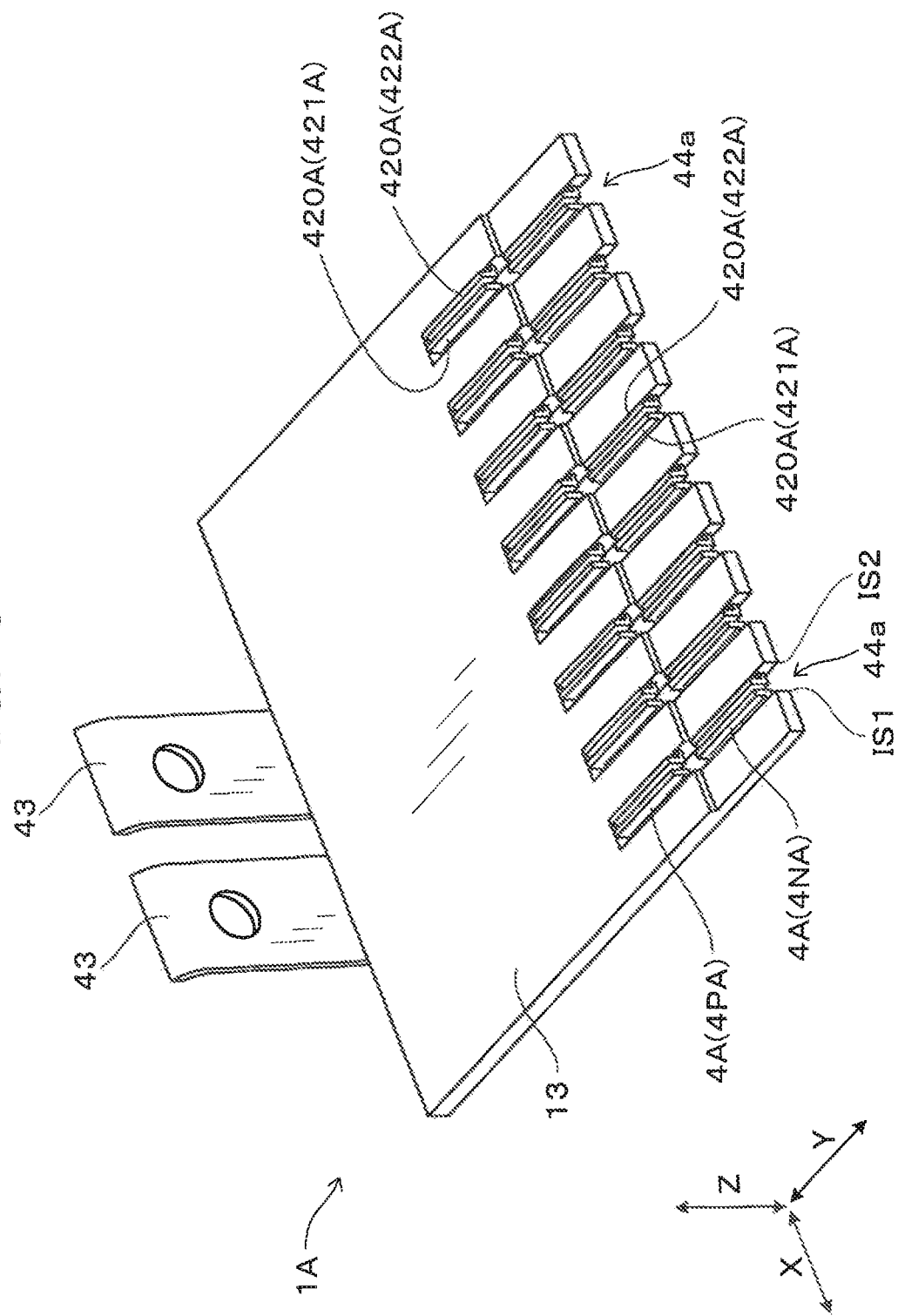
FIG. 15 is a perspective view illustrating a busbar assembly constituted by integration of a positive busbar and a negative busbar according to the second embodiment.
Figure 16:
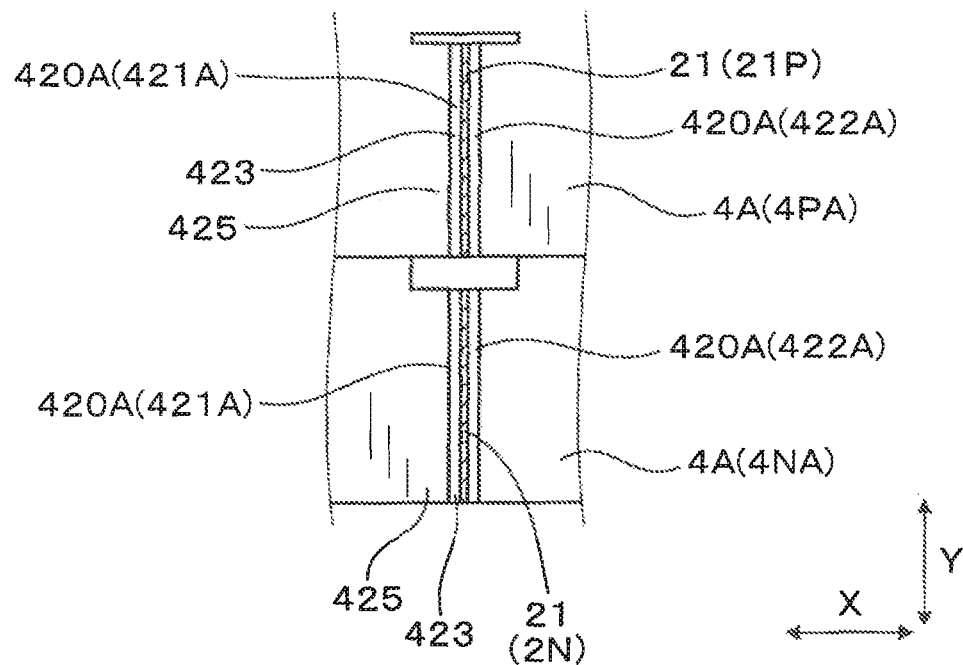
FIG. 16 is a plan view illustrating a joint portion between a common power terminal and positive and negative semiconductor-connection terminals of the power converter according to the second embodiment.

Referring to FIG. 12, the negative busbar 4N has a substantially rectangular-parallelepiped plate-like shape. Specifically, the negative busbar 4N is comprised of a rectangular-parallelepiped body 40 having opposing first and second major surfaces 40S1 and 40S2 in the Z direction and opposing first and second ends 40a and 40b in the Y direction.

The negative busbar 4N is also comprised of slits 44a defined through the first end 40a of the body 40 and extending inwardly, resulting in separate members 44 adjacent to the slits 44a; each of the slits 44a has a predetermined longitudinal length and a predetermined width. The longitudinal length of each slit 44a of the negative busbar 4N is longer than the longitudinal length of the corresponding slit 44a of the positive busbar 4P while the width of each slit 44a of the negative busbar 4N is equal to the width of the corresponding slit 44a of the positive busbar 4P.

As illustrated in, for example, FIG. 2, the slits 44a are arranged to face the respective first side surfaces 20a of the semiconductor bodies 20 of the respective semiconductor-connection terminals 2.

The negative busbar 4N is further comprised of plural sets of semiconductor-connection terminals 42 for the respective slits 44a. For example, three semiconductor-connection terminals 42 in each set are provided for the corresponding one of the slits 44a.

That is, each of the slits 44a is comprised of a pair of opposing first and second inner peripheral surfaces IS1 and IS2 and an inner bottom surface IB of the negative busbar 4N.

Referring to FIGS. 5, 7, and 12, the semiconductor-connection terminals 42 for each set includes first busbar terminals 421 and a second busbar terminal 422. Each of the first busbar terminals 421 extends toward the capacitor module 3 from one of the first and second inner peripheral surfaces IS1 and IS2, and the second busbar terminal 422 extends toward the capacitor module 3 from the other of the first and second inner peripheral surfaces IS1 and IS2 such that the first busbar terminals 421 and the second busbar terminal 422 are non-overlapped with each other when the negative busbar 4N is viewed in the X direction.

For example, the first busbar terminals 421 are provided on the first inner peripheral surface IS1 to have a space therebetween, and the second busbar terminal 422 is provided on the second inner peripheral surface IS2 to face the space between the first busbar terminals 421.

Additionally, the negative busbar 4N is comprised of a capacitor-connection terminal 43 attached to a predetermined portion of the second end 40b of the body 40 to extend toward the capacitor module 3 in the Z direction; the capacitor-connection terminal 43 of the negative busbar 4N is adjacent to the capacitor-connection terminal 43 of the positive busbar 4P.

Figure 10:
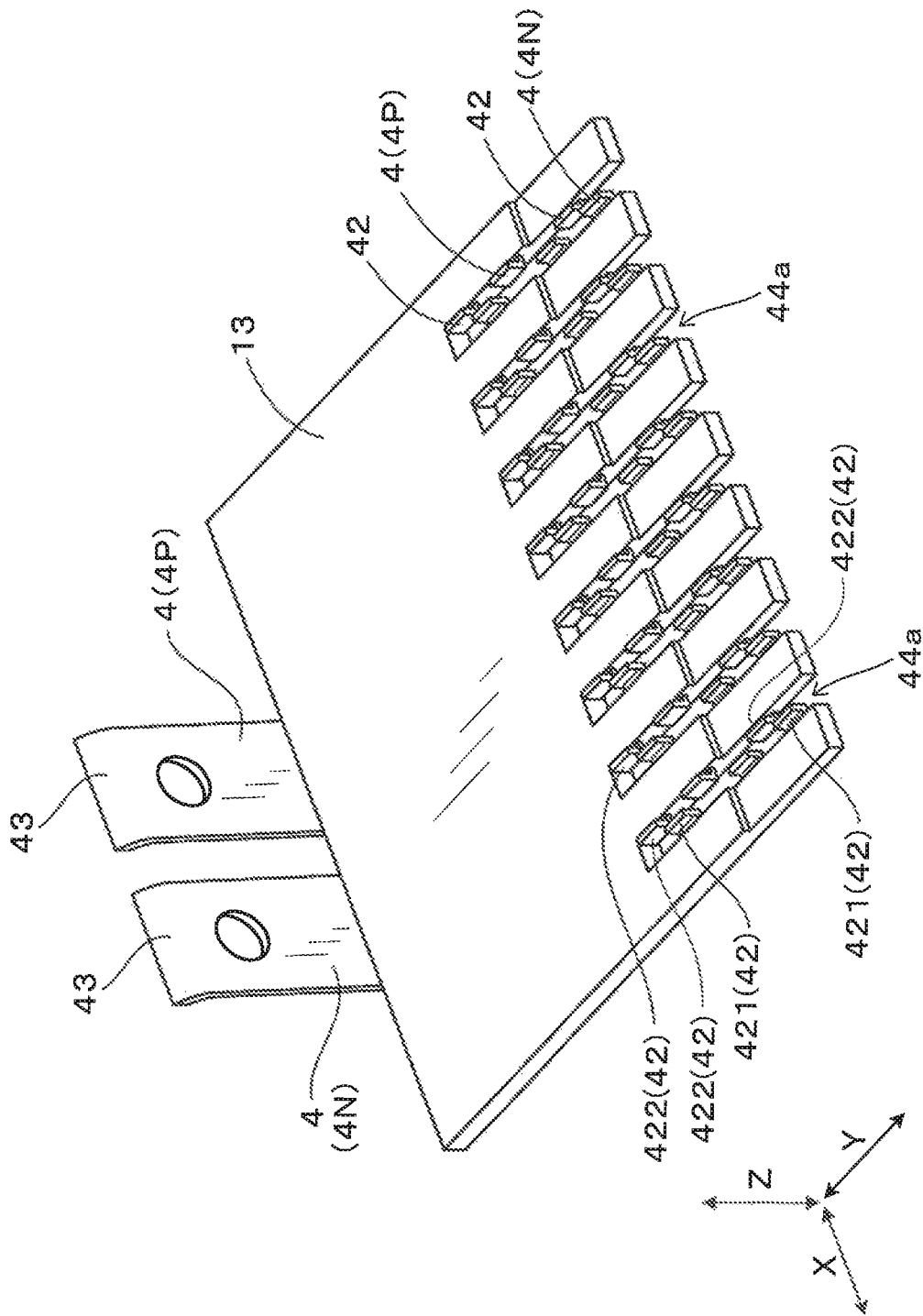
FIG. 10 is a perspective view illustrating a busbar assembly constituted by integration of a positive busbar and a negative busbar according to the first embodiment.

That is, referring to FIG. 10, the positive busbar 4P illustrated in FIG. 11 and the negative busbar 4N illustrated in FIG. 12 are integrated with each other via an electrical insulation member 13 to constitute a busbar assembly while (1) The positive busbar 4P is located above the negative busbar 4N, that is, the second major surface 40S2 of the positive busbar 4P faces the first major surface 40S1 of the negative busbar 4N (2) Each slit 44a of the positive busbar 4P is aligned with the corresponding slit 44a of the negative busbar 4N (3) The semiconductor-connection terminal 421 (42) of the positive busbar 4P is substantially aligned with the semiconductor-connection terminals 421 (42) of the negative busbar 4N in the Y direction (4) The semiconductor-connection terminals 422 (42) of the positive busbar 4P are substantially aligned with the semiconductor-connection terminal 422 (42) of the negative busbar 4N in the Y direction (5) The capacitor-connection terminal 43 of the positive busbar 4P is aligned with the capacitor-connection terminal 43 of the negative busbar 4N in the X direction Referring to, for example, FIGS. 1 and 4, each of the positive power terminals 21P is arranged such that its extending end 21A is located in the corresponding one of the slits 44a of the positive busbar 4P, resulting in the first surface 211 of the extending end 21A abutting onto the first busbar terminal 421 of the positive busbar 4P, and the second surface 212 of the extending end 21A abutting onto the second busbar terminals 422 of the positive busbar 4P.

Similarly, each of the negative power terminals 21N is arranged such that its extending end 21A is located in the corresponding one of the slits 44a of the negative busbar 4N, resulting in the first surface 211 of the extending end 21A abutting onto the first busbar terminals 411 of the negative busbar 4N, and the second surface 212 of the extending end 21A abutting onto the second busbar terminal 422 of the negative busbar 4N.

In particular, in each of the aligned slits 44a as illustrated in FIG. 10, the second busbar terminal 422 of the positive busbar 4P, which is the closest to the corresponding negative power terminal 21N, is shifted in the X direction from the first busbar terminal 421 of the negative busbar 4N, which is the closest to the corresponding positive power terminal 21P.

The second busbar terminals 422 of the positive busbar 4P, which are the closest to the capacitor-connection terminals 43, are aligned with each other in the X direction.

Each of the capacitor-connection terminals 43 includes at its extending end a through hole 43a. Referring to FIG. 1, the positive busbar 4P is arranged such that the through hole 43a of the capacitor-connection terminal 43 faces the connection end 31a of the positive electrode 31 of the capacitor module 3. The capacitor-connection terminal 43 of the positive busbar 4P is fastened to the connection end 31a of the positive electrode 31 of the capacitor module 3 with a bolt 11. Similarly, the negative busbar 4N is arranged such that the through hole 43a of the capacitor-connection terminal 43 faces the connection end 31a of the negative electrode 31 of the capacitor module 3. The capacitor-connection terminal 43 of the negative busbar 4N is fastened to the connection end 31a of the negative electrode 31 of the capacitor module 3 with a bolt 11.

In particular, referring to, for example, FIG. 4, each of the semiconductor-connection terminals 42 (421, 422) is comprised of a base 425, a bent portion 424, and a connector portion 423.

The base 425 extends from the corresponding one of the inner peripheral surfaces IS1 and IS2 in the X direction toward the extending end 21A of the corresponding power terminal 21. In other words, the base 425 is arranged to face the extending end 21A, and extends to intersect with the extending end 21A. The bent portion 424 has a bent shape and is continuously joined from the base 425 toward the capacitor module 3, and the connector portion 423 continuously extends from the bent portion 424 in the Z direction toward the capacitor module 3 along the corresponding one of the first and second surfaces 211 and 212 of the extending end 21A of the corresponding power terminal 21.

The connector portions 423 of the first busbar terminals 421 and the connector portions 423 of the second busbar terminals 422, which are abutted onto the common power terminal 21, project from the corresponding bent portions 424 toward the same direction, i.e. toward the capacitor module 3. That is, each of the connector portions 423 is bent from the corresponding base 425 via the corresponding bent portion 424 to stand and extend toward the opposite direction of the package 20 of the corresponding semiconductor module 2. Each of the bases 425 is arranged to be substantially perpendicular to the Z direction.

Referring to FIG. 4, the connector portion 423, the bent portion 424, and the base 425 of each semiconductor-connection terminal 42 respectively have outer surfaces 423f, 424f, and 425f. The curvature of the bent portion 424 continuously joining between the base 425 and the connector portion 423 of each semiconductor-connection terminal 42 is set to smoothly join the outer surfaces 423f and 425f. If each of the busbars 4 has a thickness t as illustrated in FIG. 4, the radius of curvature of the outer surface 424f of each bent portion 424 when viewed in the Y direction can be set to be equal to or more than the thickness t. Preferably, the radius of curvature of the outer surface 424f of each bent portion 424 when viewed in the Y direction is set to be equal to or more than twice the thickness t.

The connector portion 423 of each of the semiconductor-connection terminal 42 and the extending end 21A of the corresponding power terminal 21 are joined to each other while being superimposed with each other in the X direction. Specifically, the outer surface 423f of the connector portion 423 of each first busbar terminal 421 is superimposed on the first surface 211 of the extending end 21A of the corresponding power terminal 21. Similarly, the outer surface 423f of the connector portion 423 of each second busbar terminal 422 is superimposed on the second surface 212 of the extending end 21A of the corresponding power terminal 21. The extending end of each of the connector portions 423 and the tip of the extending end 21A of the corresponding power terminal 21 have the same direction. Specifically, the extending end of each of the connector portions 423 and the tip of the extending end 21A of the corresponding power terminal 21 are directed toward the capacitor module 3 that is opposite to the direction toward the corresponding semiconductor module 2.

The outer surface 423f of the connector portion 423 of each first busbar terminal 421 is joined to the first surface 211 of the extending end 21A of the corresponding power terminal 21 by, for example, welding, such as laser welding. Similarly, the outer surface 423f of the connector portion 423 of each second busbar terminal 422 is joined to the second surface 212 of the extending end 21A of the corresponding power terminal 21 by, for example, welding, such as laser welding. Note that, in FIG. 4 or other figures, the shape of the joint portion, such as the welded portion, between each connector portion 423 and the extending end 21A of the corresponding power terminal 21 is omitted in illustration. Each connector portion 423 and the extending end 21A of the corresponding power terminal 21 can be joined to each other by another joining method, such as brazing or soldering.

The power converter 1 according to the first embodiment can be installed in a vehicle, such as an electrical vehicle or a hybrid vehicle. The power 1 can be configured to convert direct-current (DC) power into alternating-current (AC) power for activating a motor, AC power into DC power, and/or a level of DC power into another level.

The capacitor module 3 is electrically connected between a DC power source and the inverter circuit constituted by the semiconductor modules 2. The capacitor module 3 serves as a smoothing capacitor for smoothing a voltage applied to the inverter circuit.

Next, the following describes how the power converter 1 works to obtain benefits.

The power converter 1 is configured such that the first and second major surfaces 211 and 212 of the extending end 21A of each power terminal 21 are joined to the semiconductor-connection terminals 42 of the corresponding one of the positive busbar 4P and the negative busbar 4N. This configuration enables each power terminal 21 to be easily located to the semiconductor-connection terminals 42 of the corresponding one of the positive busbar 4P and the negative busbar 4N. Specifically, arranging each power terminal 21 while the first and second major surfaces 211 and 212 are abutted onto the respective first busbar terminals 421 and second busbar terminals 42 of the corresponding one of the positive busbar 4P and the negative busbar 4N enables alignment between each power terminal 21 and the semiconductor-connection terminals 42 of the corresponding one of the positive busbar 4P and the negative busbar 4N to be easily carried out.

That is, when aligning each power terminal 21 with the corresponding one of the positive and negative busbars 4P and 4N, the corresponding power terminal 21 is sandwiched between the first busbar terminals 421 and the second busbar terminals 422 in the X direction (see FIGS. 2 to 4). This enables each power terminal 21 to be easily aligned with the corresponding one of the positive and negative busbars 4P and 4N. While each power terminal 21 is aligned with the corresponding one of the positive and negative busbars 4P and 4N, the first and second surfaces 211 and 212 of each power terminal 21 are welded to the semiconductor-connection terminals 42 of the corresponding one of the positive busbar 4P and the negative busbar 4N.

This therefore makes it possible to weld the first and second surfaces 211 and 212 of each power terminal 21 to the semiconductor-connection terminals 42 of the corresponding one of the positive busbar 4P and the negative busbar 4N while preventing the occurrence of a positional gap between the corresponding power terminal 21 and the semiconductor-connection terminals 42 of the corresponding one of the positive busbar 4P and the negative busbar 4N. This therefore results in improvement of productivity of the power converter 1.

Additionally, each busbar 4 is joined to both the first and second major surfaces 211 and 212 of the corresponding power terminals 21. For this reason, as illustrated by allows i in FIGS. 4 and 5, current-flow paths from the positive busbar 4P to each of the positive power terminals 21P are provided through both the first major surface 211 and the second major surface 212 of the corresponding positive power terminals 21P. Similarly, current-flow paths to the negative busbar 4N from each of the negative power terminals 21N are provided through both the first major surface 211 and the second major surface 212 of the corresponding negative power terminals 21N.

That is, this configuration of the power converter 1 makes it possible to allocate, for each power terminal 21, two current-flow paths via the respective first and second major surfaces 211 and 212. This therefore makes it possible to increase the total area of the current-flow paths between each busbar 4 and the corresponding power terminals 21, resulting in each busbar 4 having lower inductance.

In addition, the power converter 1 is configured such that the first busbar terminals 421 and the second busbar terminals 422 connected to the common power terminal 21 are non-overlapped with each other when viewed in the X direction. This makes it possible to reduce the manufacturing cost of the busbars 4. Specifically, cutting and bending of a single metal plate enables each busbar 4 including the semiconductor-connection terminals 4 to be easily manufactured, resulting in lower cost of materials required to manufacture each busbar 4.

For example, in order to manufacture a busbar 4 having the structure set forth above as illustrated in FIG. 5, a part of a rectangular-parallelepiped metal plate 49 was cut, so that the metal plate 49 having a slit S1 was produced. The slit S1 resulted in parts P1, P2, and P3 respectively corresponding to the second busbar terminal 422, the first busbar terminal 421, and the second busbar terminal 422 being generated. Thereafter, bending each of the parts P1 to P3 along a corresponding dashed line B enables one set of the two second busbar terminals 422 and the first busbar terminal 421 to be created. That is, efficiently using such an inexpensive easily-available metal plate enables the semiconductor-connection terminals 42 to be easily created, resulting in lower material cost of the power converter 1.

Each of the semiconductor-connection terminals 42 (421, 422) is comprised of the connector portion 423, and the connector portion 423 of each of the semiconductor-connection terminals 42 (421, 422) is located to face the corresponding one the first major surface 211 and the second major surface 212 of the corresponding one of the power terminals 21. This enables the alignment of each power terminal to the corresponding one of the positive and negative busbars 4P and 4N to be easily carried out.

The connector portions 423 of the first busbar terminals 421 and the connector portions 423 of the second busbar terminals 422, which are abutted onto the common power terminal 21, project from the corresponding bent portions 424 toward the same direction, i.e. toward the capacitor module 3. This enables the abutment state of the first power terminals 421 onto the common power terminal 21 and the abutment state of the second power terminals 422 onto the common power terminal 21 to be substantially identical to each other. This therefore enables the first power terminals 421 and the second power terminals 422 to be easily welded to the common power terminal 21.

In particular, each of the connector portions 423 of the first and second power terminals 421 and 422 is bent from the corresponding base 425 via the corresponding bent portion 424 to stand and extend toward the same side of the Z direction. This enables the structure of each busbar 4 in the Z direction to be simpler, resulting in the structure of the power converter 1 in the Z direction being therefore simpler.

Each of the connector portions 423 is bent from the corresponding base 425 via the corresponding bent portion 424 to stand and extend toward the opposite direction of the package 20 of the corresponding semiconductor module 2. This configuration enables, as illustrated in FIG. 4, the flow of a current i flowing through each of the connector portions 423 to be opposite to the flow of a current i flowing through the common power terminal 21.

That is, the direction of the first current path from each of the first busbar terminals 421 and second terminals 422 through the corresponding connector portion 423 is opposite to the direction of the second current path flowing back to the common power terminal 21. This therefore enables magnetic flux caused from the current i flowing through the first current path and magnetic flux caused from the current i flowing through the second current path to cancel each other out. This results in the connection portions between the semiconductor-connection terminals 42 and each power terminal 21 having lower inductance.

The curvature of the bent portion 424 continuously joining between the base 425 and the connector portion 423 of each semiconductor-connection terminal 42 is set to smoothly join the outer surfaces 423f and 425f. This enables, when inserting a power terminal 21 between the first busbar terminals 421 and the second busbar terminals 422, the outer surfaces 423f to guide the insertion of the power terminal 21 between the first busbar terminals 421 and the second busbar terminals 422. This enables alignment between each power terminal 21 and the semiconductor-connection terminals 42 of the corresponding one of the positive busbar 4P and the negative busbar 4N to be easily carried out, resulting in improvement of the productivity of the power converter 1.

The number of one of the first busbar terminals 421 and the second busbar terminals 422 to be connected to the common power terminal 21 is set to be equal to or more than 2, and the number of the other of the first busbar terminals 421 and the second busbar terminals 422 to be connected to the common power terminal 21 is set to be equal to or more than 1. This enables the common power terminal 21 to be stably arranged between the first and second busbar terminals 421 and 422. This enables alignment between each power terminal 21 and the semiconductor-connection terminals 42 of the corresponding one of the positive busbar 4P and the negative busbar 4N to be easily carried out, resulting in easier welding of each power terminal 21 to the semiconductor-connection terminals 42 of the corresponding one of the positive busbar 4P and the negative busbar 4N. In particular, the first busbar terminals 421 and the second busbar terminals 422 connected to the common power terminal 21 are non-overlapped with each other when viewed in the X direction, resulting in more stably connection between each power terminal 21 to the semiconductor-connection terminals 42 of the corresponding one of the positive busbar 4P and the negative busbar 4N.

Additionally, as illustrated in FIG. 8, the positive and negative power terminals 21P and 21N are separately arranged to be adjacent to each other in the Y direction, resulting in easier electrical separation between the positive and negative power terminals 21P and 21N. This enables the spaces between the adjacent semiconductor modules 2 in the X direction while ensuring electrical separation between the positive and negative power terminals 21P and 21N of each semiconductor module 2, making it possible for the power converter 1 to have simpler structure.

In particular, in each of the aligned slits 44a as illustrated in FIG. 10, the second busbar terminal 422 of the positive busbar 4P, which is the closest to the corresponding negative power terminal 21N, is shifted in the X direction from the first busbar terminal 421 of the negative busbar 4N, which is the closest to the corresponding positive power terminal 21P. This enables easier electrical separation between the positive and negative busbar 4P and 4N to be established.

The second busbar terminals 422 of the positive busbar 4P, which are the closest to the capacitor-connection terminals 43, are aligned with each other in the X direction. This enables variations in length between each of the capacitor-connection terminals 43 and the corresponding one of the power terminals 21 to be reduced, making it possible to uniform the electrical characteristics between the semiconductor modules 2.

As described in detail above, the first embodiment provides power converters, such as the power converter 1, having lower inductance of each busbar 4 and superior productivity.

Second Embodiment

The following describes a power converter 1A according to the second embodiment of the present disclosure with reference to FIGS. 14 to 17. The configuration and functions of the power converter 1A according to the second embodiment are mainly different from those of the power converter 1 according to the first embodiment by the following points. The following therefore mainly describes the different points.

The power converter 1A includes each of busbars 4A, i.e. positive and negative busbars 4PA and 4NA, and each of the positive and negative busbars 4PA and 4NA includes semiconductor-connection terminals 420A that are different from the semiconductor-connection terminals 42.

The positive busbar 4PA is comprised of plural sets of the semiconductor-connection terminals 420A for the respective slits 44a. For example, two semiconductor-connection terminals 420A in each set are provided for the corresponding one of the slits 44a.

The semiconductor-connection terminals 420A for each set of the positive busbar 4PA includes a first busbar terminal 421A and a second busbar terminal 422A. The first busbar terminal 421A extends toward the capacitor module 3 from the first inner peripheral surface IS1, and the second busbar terminal 422A extend toward the capacitor module 3 from the second inner peripheral surface IS2 such that the first busbar terminal 421 and the second busbar terminal 422 are overlapped with each other when the positive busbar 4P is viewed in the X direction.

Similarly, the negative busbar 4NA is comprised of plural sets of the semiconductor-connection terminals 420A for the respective slits 44a. For example, two semiconductor-connection terminals 420A in each set are provided for the corresponding one of the slits 44a.

The semiconductor-connection terminals 420 for each set of the negative busbar 4NA includes a first busbar terminal 421A and a second busbar terminal 422A. The first busbar terminal 421A extends toward the capacitor module 3 from the first inner peripheral surface IS1, and the second busbar terminal 422A extend toward the capacitor module 3 from the second inner peripheral surface IS2 such that the first busbar terminal 421A and the second busbar terminal 422A are overlapped with each other when the positive busbar 4P is viewed in the X direction.

This configuration enables the direction of a current i flowing through the first busbar terminal 421A to be opposite to the direction of a current i flowing through the corresponding second busbar terminal 422A. In particular, the base 425 of the first busbar terminal 421A is parallel to the base 425 of the second busbar terminal 422A in the Y direction, resulting in magnetic flux caused from the current i flowing through the base 425 of the first busbar terminal 421A and magnetic flux caused from the current i flowing through the base 425 of the second busbar terminal 422A cancelling each other out. This results in each busbar 4 of the power converter 1A having lower inductance.

This configuration of the power converter 1A enables the length of each of the first and second busbar terminals 421A and 422A to be longer in the Y direction, resulting in each busbar 4 of the power converter 1A having further lower inductance. This configuration of the power converter 1A also enables each of the first and second busbar terminals 421A and 422A having a longer length in the Y direction to face the corresponding one of the first and second major surfaces 211 and 212 of the corresponding power terminals 21. This therefore results in magnetic flux caused from a current flowing through the connector terminal 423 of each of the first and second busbar terminals 421A and 422A and a current flowing through the corresponding power terminals 21 cancelling each other out. This therefore results in each busbar 4 of the power converter 1A having further lower inductance.

Figure 17:
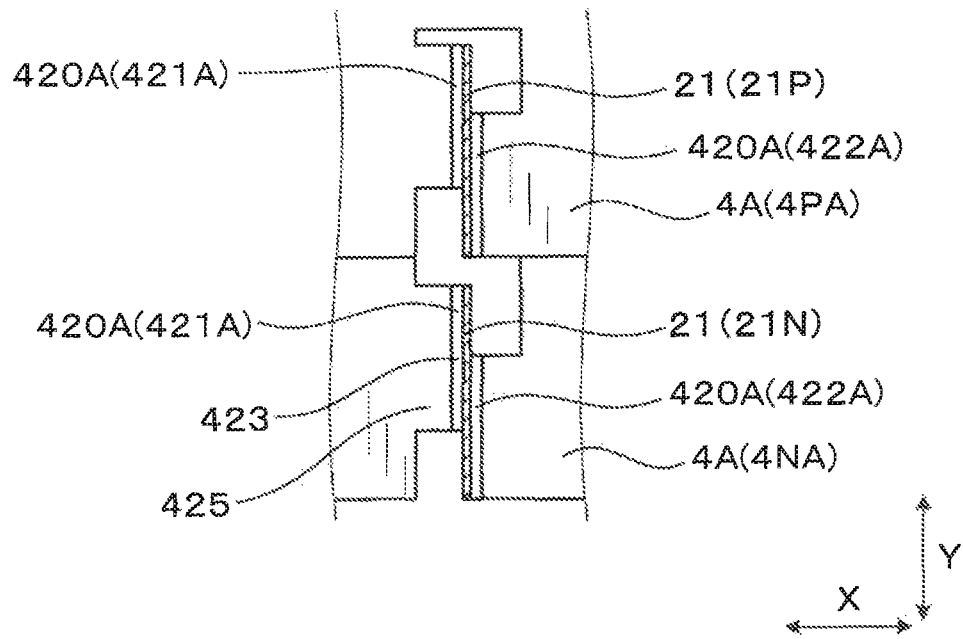
FIG. 17 is a plan view illustrating a joint portion between a common power terminal and positive and negative semiconductor-connection terminals of the power converter according to a modification of the second embodiment.

Note that, as illustrated in FIG. 17, a part of the first busbar terminal 421A in the Y direction can be configured to face a part of the corresponding second busbar terminal 422A in the Y direction, so that one of the first busbar terminal 421A and the corresponding second busbar terminal 422A is partially shifted in the Y direction from the other of the first busbar terminal 421A and the corresponding second busbar terminal 422A.

That is, when viewed in the X direction, a part of the first busbar terminal 421A is overlapped with a part of the corresponding second busbar terminal 422A while the remaining part of the first busbar terminal 421A is non-overlapped with the remaining part of the corresponding second busbar terminal 422A. In this case, the second busbar terminal 422A of the positive busbar 4PA can be arranged to be close to the negative busbar 4NA in the Y direction, and the first busbar terminal 421A of the negative busbar 4NA can be arranged to be close to the positive busbar 4PA in the Y direction.

This modification illustrated in FIG. 17 enables the power converter 1B to have a simpler size while the electrical insulation distance between the semiconductor-connection terminals 420A of the positive busbar 4PA and the semiconductor-connection terminals 420A of the corresponding negative busbar 4NA are easily ensured.

The other operations and/or benefits obtained by the power converter 1B are substantially identical to the operations and/or obtained benefits achieved by the power converter 1.

Third Embodiment

Figure 18:
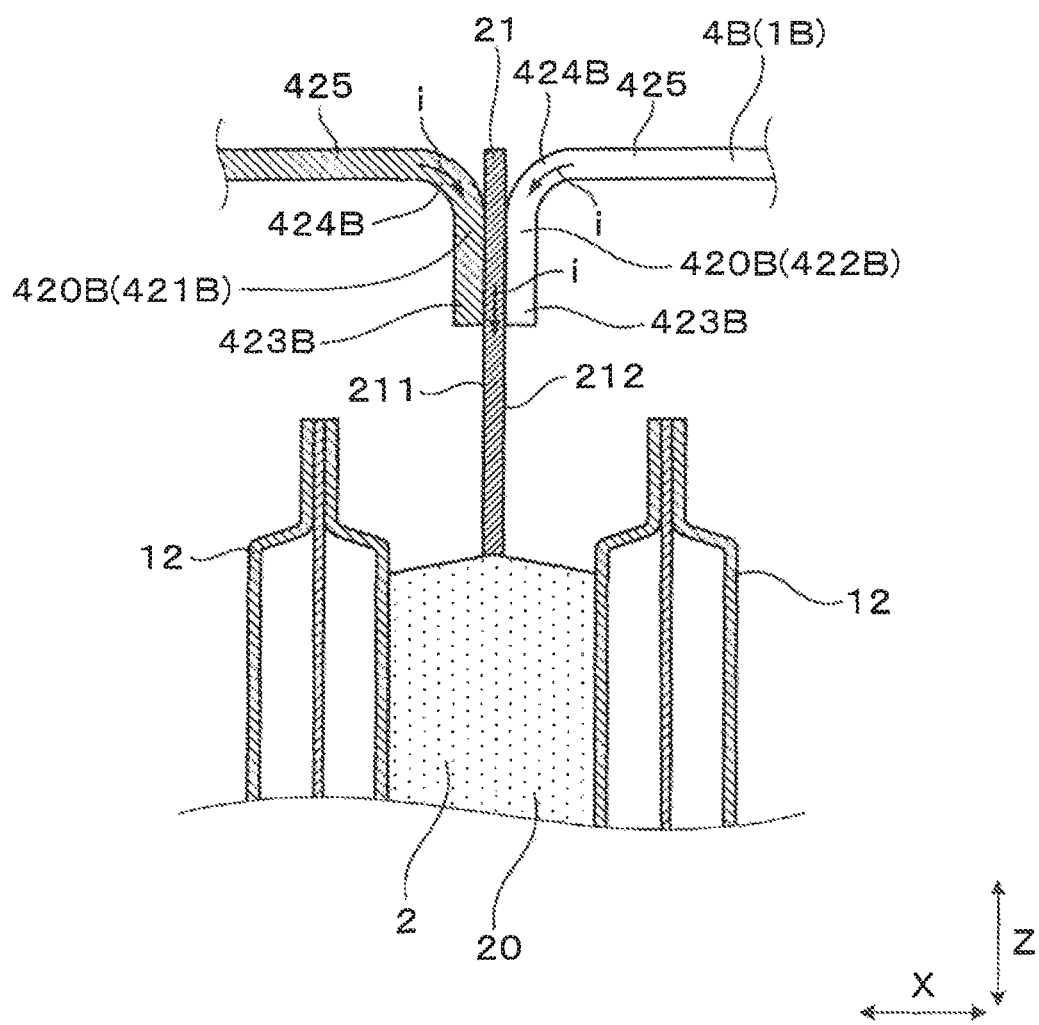
FIG. 18 is a partially cross-sectional view illustrating a joint portion between a common power terminal and semiconductor-connection terminals of a power converter according to the third embodiment of the present disclosure.

The following describes a power converter 1B according to the third embodiment of the present disclosure with reference to FIG. 18. The configuration and functions of the power converter 1B according to the third embodiment are mainly different from those of the power converter 1 according to the first embodiment by the following points. The following therefore mainly describes the different points.

The power converter 1B includes each of busbars 4B, and each of the busbars 4B includes semiconductor-connection terminals 420B that are different from the semiconductor-connection terminals 42.

Each of the semiconductor-connection terminals 420B, i.e. positive busbars 421B and negative busbars 422B, is comprised of the base 425 extending from the corresponding one of the inner peripheral surfaces IS1 and IS2 in the X direction, a bent portion 424B continuously bent from the base 425 toward the corresponding semiconductor module 2, and a connector portion 423B continuously extending from the bent portion 424B in the Z direction toward the corresponding semiconductor module 2 along the corresponding one of the first and second surfaces 211 and 212 of the extending end 21A of the corresponding power terminal 21.

The connector portions 423B of the first busbar terminals 421B and the connector portions 423B of the second busbar terminals 422B, which are abutted onto the common power terminal 21, project from the corresponding bent portions 424B toward the same direction, i.e. toward the package 20 of the corresponding semiconductor module 2. The connector portion 423B of each first busbar terminal 421B is joined to the extending end 21A of the corresponding power terminal 21 by, for example, welding, and the connector portion 423B of each second busbar terminal 422B is joined to the extending end 21A of the corresponding power terminal 21 by, for example, welding.

This configuration of the power converter 1B enables the joint portions between the common power terminal 21 and the connector portions 423B of the first and second busbar terminals 421B and 422B to be located closer to the corresponding semiconductor module 2. This enables a current path between each semiconductor module 2 and the capacitor module via the positive and negative busbars 4B to be shorter, resulting in lower inductance of the current path.

The connector portions 423B of the first busbar terminals 421B and the connector portions 423B of the second busbar terminals 422B are located to face the common power terminal 21, making it easy to align each power terminal 21 with the corresponding one of the busbars 4B. The connector portions 423B of the first busbar terminals 421B and the connector portions 423B of the second busbar terminals 422B are maintained to face the common power terminal 21 independently of the power converter 1B having erection tolerance and/or dimensional tolerance in the Z direction, making it possible to therefore ensure the stable joint portions between the connector portions 423B of the first and second busbar terminals 421B and terminals 422B and the common power terminal 21.

In addition, as illustrated in FIGS. 8 and 18, the cooling pipes 12 are located at both sides of each semiconductor module 2 in the X direction. The length of each cooling pipe 12 has a longer length in the Z direction than the length of the package 20 of each semiconductor module 2 in the Z direction. This results in space being ensured between each power terminal 21 and the cooling pipes 12. At that time, the connector portions 423B of each of the busbars 4B standing from the corresponding bent portions 424B toward the space. This results in the power converter 1B having a simpler size in the Z direction while maintains an electrical insulation distance between the cooking pipes 12 and each busbar 4.

The other operations and/or benefits obtained by the power converter 1B are substantially identical to the operations and/or obtained benefits obtained by the power converter 1.

Fourth Embodiment

Figure 19:
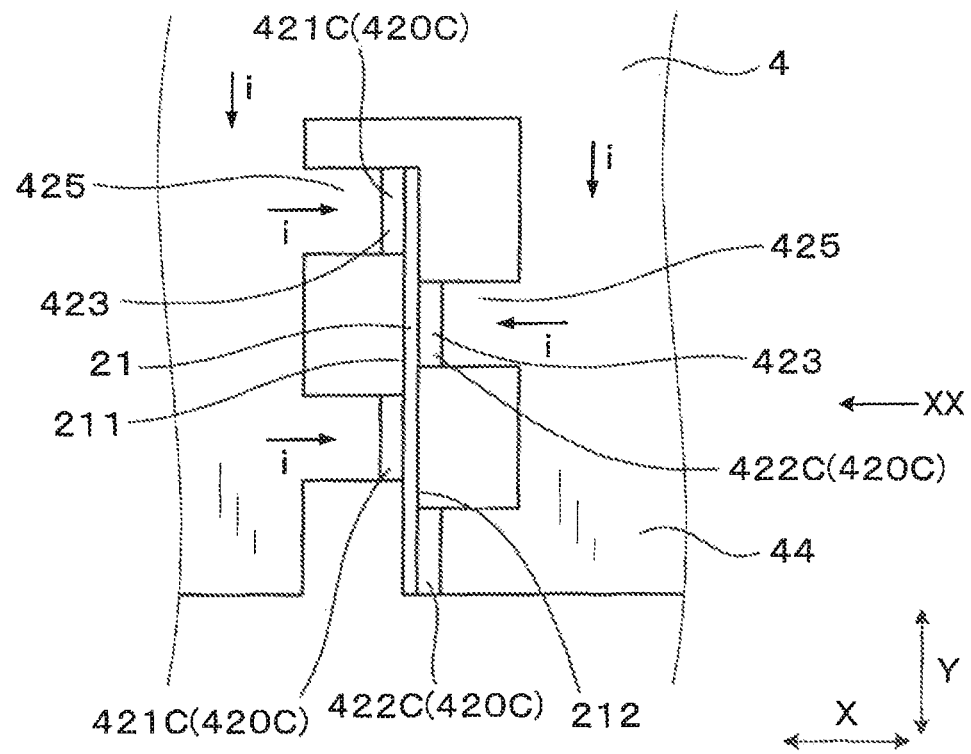
FIG. 19 is a plan view illustrating a joint portion between a common power terminal and semiconductor-connection terminals of the power converter according to the third embodiment.
Figure 20:
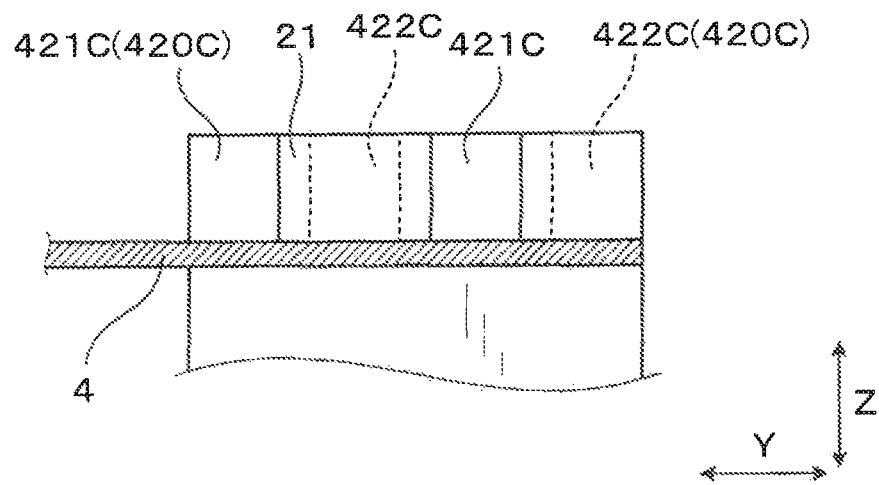
FIG. 20 is a perspective view of the joint portion illustrated in FIG. 19 when viewed from arrow XX.

The following describes a power converter 1C according to the fourth embodiment of the present disclosure with reference to FIGS. 19 and 20. The configuration and functions of the power converter 1C according to the fourth embodiment are mainly different from those of the power converter 1 according to the first embodiment by the following points. The following therefore mainly describes the different points.

The power converter 1C includes each of busbars 4C, i.e. positive and negative busbars 4C, and each of the positive and negative busbars 4C includes semiconductor-connection terminals 420C that are different from the semiconductor-connection terminals 42.

Each busbar 4C is comprised of plural sets of the semiconductor-connection terminals 420C for the respective slits 44a.

The semiconductor-connection terminals 420C for each set of each busbar 4C includes a predetermined number of first busbar terminals 421C and the same number of second busbar terminals 422C. The first busbar terminals 421C extend toward the capacitor module 3 from the first inner peripheral surface IS1, and the second busbar terminals 422C extend toward the capacitor module 3 from the second inner peripheral surface IS2 such that the first busbar terminals 421C and the second busbar terminals 422C are non-overlapped with each other when the corresponding busbar 4C is viewed in the X direction.

In particular, the semiconductor-connection terminals 420C for each set of each busbar 4C includes two first busbar terminals 421C and two second busbar terminals 422C (see FIG. 19). Note that the semiconductor-connection terminals 420C for each set of each busbar 4C can includes three or more first busbar terminals 421C and three or more second busbar terminals 422C.

As illustrated in FIGS. 19 and 20, the two first busbar terminals 421C and the two second busbar terminals 422C are alternately arranged in the Y direction. That is, one of the second busbar terminals 422C is arranged between the two first busbar terminals 421C, and one of the first busbar terminals 421C is arranged between the two second busbar terminals 422C when viewed in the X direction.

This configuration of the power converter 1C enables a current i flowing from each busbar 4C to the corresponding power terminal 21 and a current flowing from each power terminal 21 to the corresponding busbar 4C to be equally separated between a current flowing through the first major surfaces 211 and a current flowing through the second major surfaces 212. This results in each busbar 4 of the power converter 1C having lower inductance, and in reduction of the amount of heat generated at the joint portions between the busbars 4C and the power terminals 21.

The other operations and/or benefits obtained by the power converter 1C are substantially identical to the operations and/or obtained benefits obtained by the power converter 1.

Fifth Embodiment

The following describes a power converter 1D according to the fifth embodiment of the present disclosure with reference to FIGS. 21A to 24. The configuration and functions of the power converter 1D according to the fifth embodiment are mainly different from those of the power converter 1 according to the first embodiment by the following points. The following therefore mainly describes the different points.

Figure 21A:
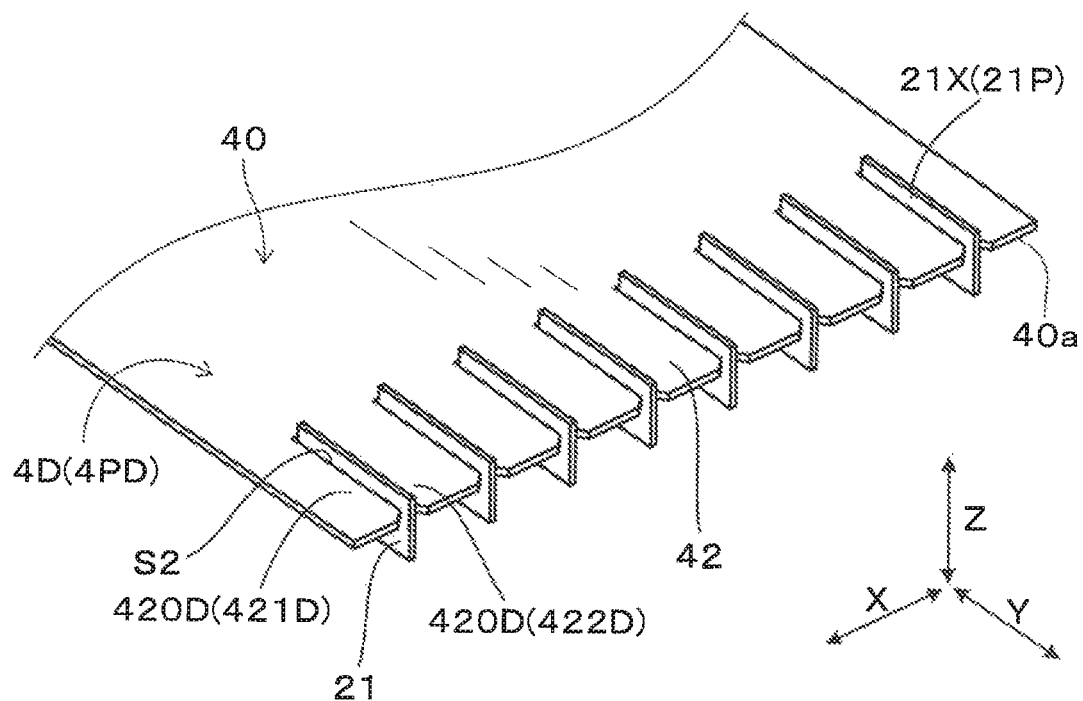
FIG. 21A is a perspective view illustrating a positive busbar according to the fifth embodiment of the present disclosure.

The power converter 1D includes each of busbars 4D, i.e. positive and negative busbars 4PD and 4ND As illustrated in FIG. 21A, the positive busbar 4PD is comprised of slits S2 formed in the first end 40a of the body 40 and extending inwardly, resulting in separate terminals 420D adjacent to the slits S2; each of the slits S2 has a predetermined longitudinal length and a predetermined width. The slits S2 are arranged to face the respective first side surfaces 20a of the semiconductor bodies 20 of the respective semiconductor-connection terminals 2.

The separate terminals 420D include first busbar terminals 421D and second busbar terminals 422D arranged alternately in the X direction.

Figure 21B:
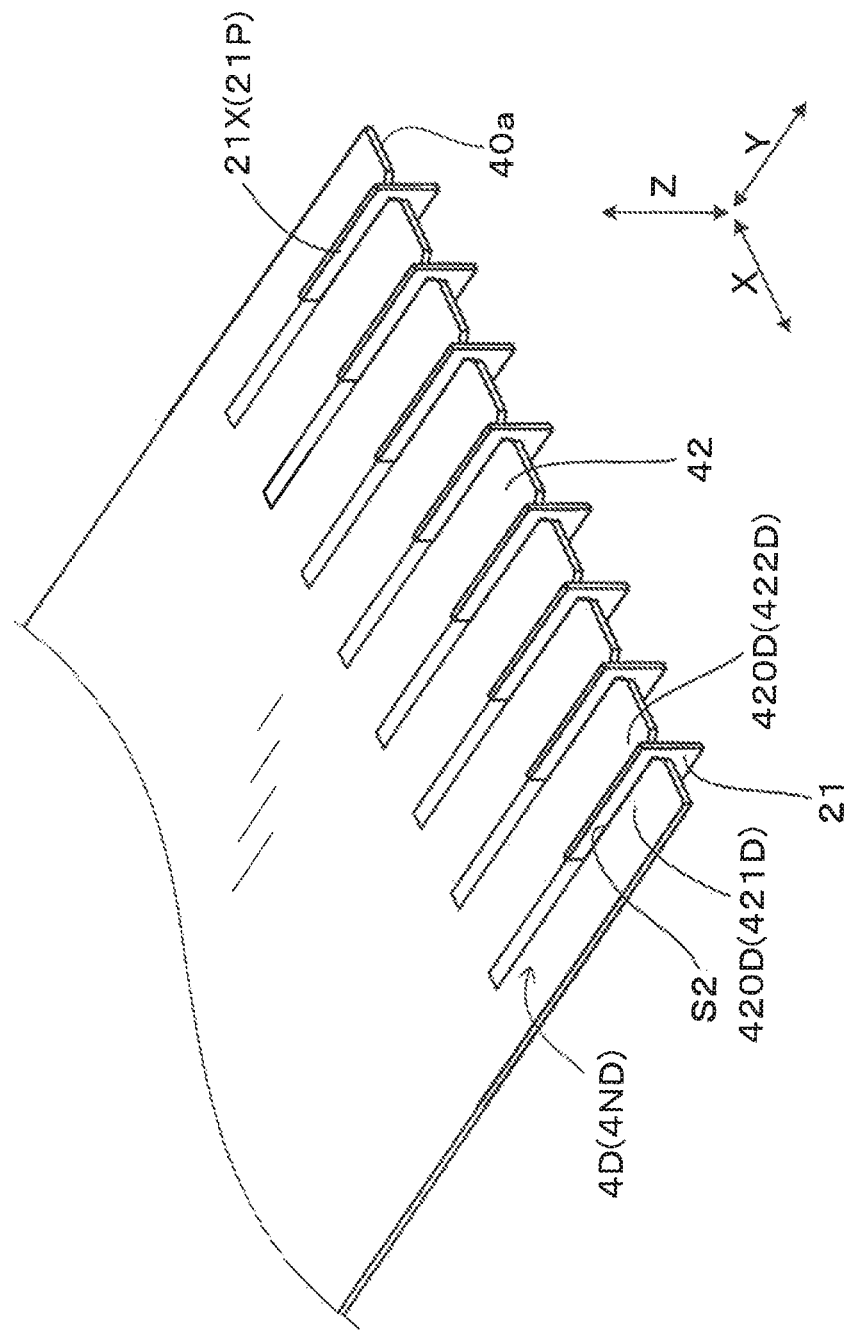
FIG. 21B is a perspective view illustrating a negative busbar according to the fifth embodiment.
Figure 22:
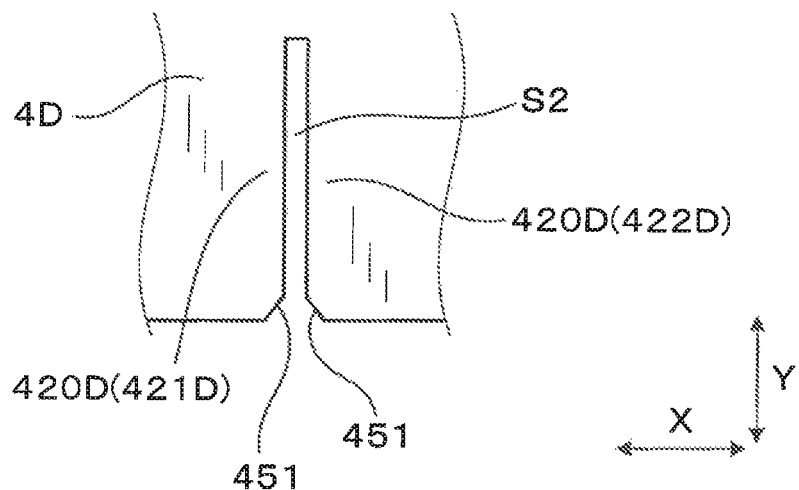
FIG. 22 is a plan view illustrating semiconductor-connection terminals of each busbar according to the fifth embodiment.
Figure 23:
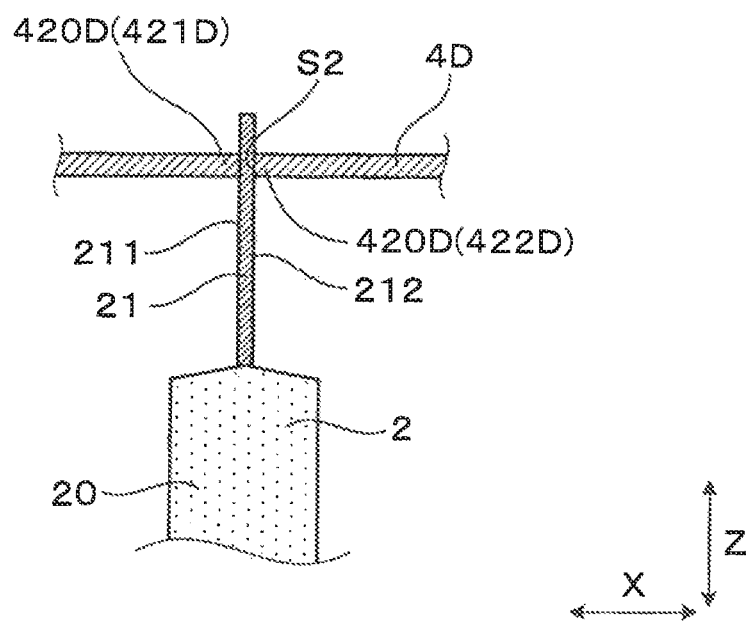
FIG. 23 is a partially cross-sectional view illustrating a joint portion between a common power terminal and semiconductor-connection terminals of the power converter according to the fifth embodiment.

Similarly, as illustrated in FIG. 21B, the negative busbar 4ND is comprised of slits S2 formed in the first end 40a of the body 40 and extending inwardly, resulting in separate terminals 420D adjacent to the slits S2; each of the slits S2 has a predetermined longitudinal length and a predetermined width. The longitudinal length of each slit 44a of the negative busbar 4ND is longer than the longitudinal length of the corresponding slit 44a of the positive busbar 4PD while the width of each slit 44a of the negative busbar 4ND is equal to the width of the corresponding slit S2 of the positive busbar 4PD. The slits S2 are arranged to face the respective first side surfaces 20a of the semiconductor bodies 20 of the respective semiconductor-connection terminals 2.

The separate terminals 420D include first busbar terminals 421D and second busbar terminals 422D arranged alternately in the X direction.

Figure 24:
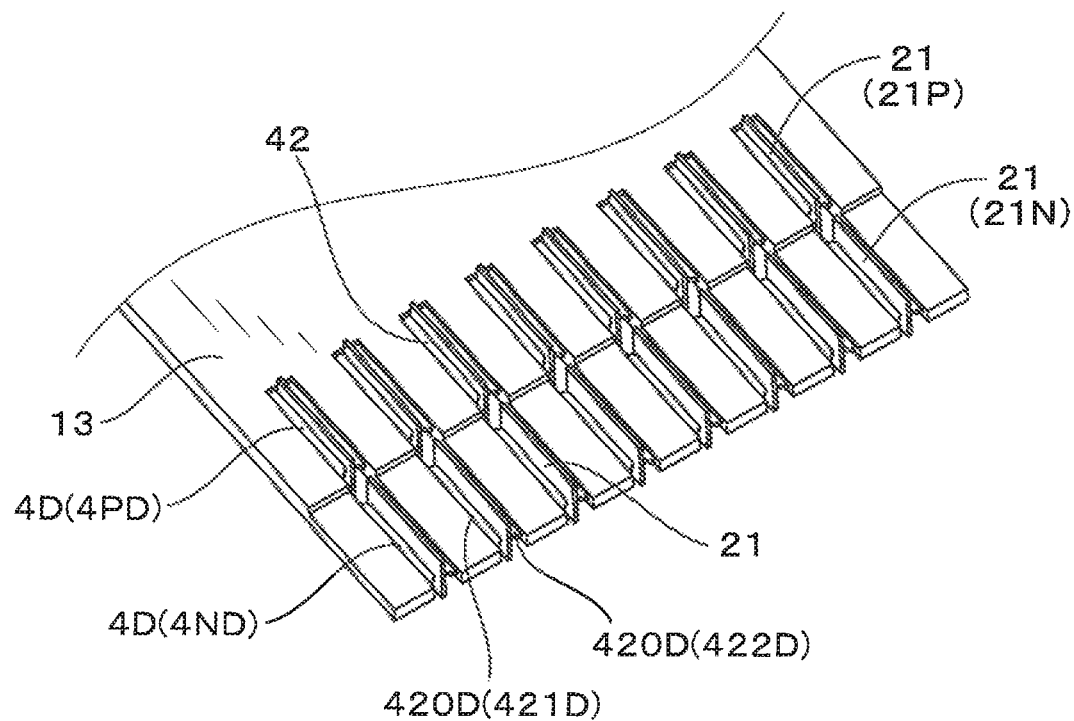
FIG. 24 is a perspective view illustrating a busbar assembly constituted by integration of the positive busbar and the negative busbar according to the fifth embodiment.

Like the first embodiment, as illustrated in FIG. 24, the positive busbar 4PD illustrated in FIG. 21A and the negative busbar 4ND illustrated in FIG. 21B are integrated with each other via the electrical insulation member 13 while (1) The positive busbar 4PD is located above the negative busbar 4ND, that is, the second major surface 40S2 of the positive busbar 4PD faces the first major surface 40S1 of the negative busbar 4ND (2) Each slit S2 of the positive busbar 4PD is aligned with the corresponding slit S2 of the negative busbar 4ND (3) The semiconductor-connection terminal 421D (420D) of the positive busbar 4PD is substantially aligned with the semiconductor-connection terminal 421D (420D) of the negative busbar 4ND in the Y direction (4) The semiconductor-connection terminal 422D (420D) of the positive busbar 4PD is substantially aligned with the semiconductor-connection terminal 422D (420D) of the negative busbar 4ND in the Y direction Referring to, FIGS. 21A, 21B, 23, and 24, each of the positive power terminals 21P is arranged such that its extending end 21A is located in the corresponding one of the slits S2 of the positive busbar 4P, resulting in the first surface 211 of the extending end 21A abutting onto the first busbar terminal 421D of the positive busbar 4PD, and the second surface 212 of the extending end 21A abutting onto the second busbar terminal 422D of the positive busbar 4PD.

Similarly, each of the negative power terminals 21N is arranged such that its extending end 21A is located in the corresponding one of the slits S2 of the negative busbar 4ND, resulting in the first surface 211 of the extending end 21A abutting onto the first busbar terminal 421D of the negative busbar 4ND, and the second surface 212 of the extending end 21A abutting facing the second busbar terminal 422D of the negative busbar 4ND.

Each of the semiconductor-connection terminal 420D and the extending end 21A of the corresponding power terminal 21 are joined to each other while being superimposed with each other in the X direction.

Specifically, the inner surface of each first busbar terminal 421D is joined to the first surface 211 of the extending end 21A of the corresponding power terminal 21. Similarly, the inner surface of each second busbar terminal 422D is joined to the second surface 212 of the extending end 21A of the corresponding power terminal 21.

In particular, each of the slits S2 formed in the first end 40a of the body 40 of the negative busbar 4ND has a tapered opening 451 toward the depth of the corresponding slit S2. This enables, when inserting a power terminal 21 in a slit S2, the tapered opening 151 to guide the insertion of the power terminal 21 into the slit S2. This enables alignment between each power terminal 21 and the semiconductor-connection terminals 420D of the corresponding one of the positive busbar 4PD and the negative busbar 4ND to be easily carried out, resulting in improvement of the productivity of the power converter 1D.

The other operations and/or benefits obtained by the power converter 1D are substantially identical to the operations and/or obtained benefits obtained by the power converter 1.

Fifth Embodiment

Figure 25:
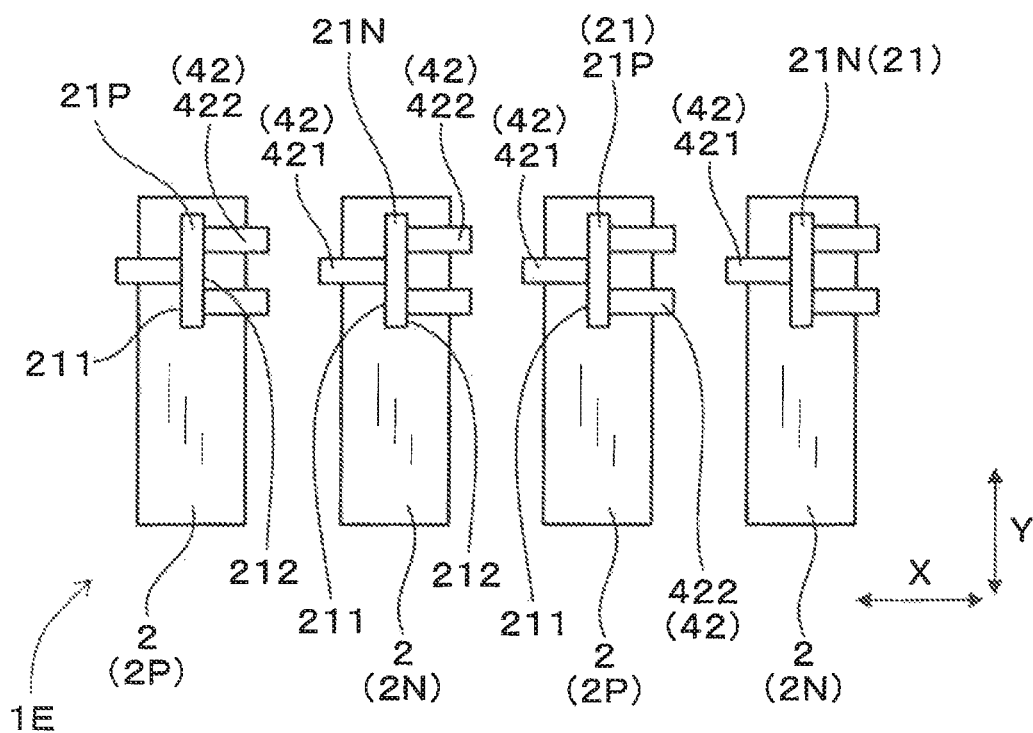
FIG. 25 is a view schematically illustrating a positional relationship between semiconductor modules adjacent to each other in an arrangement direction and semiconductor-connection terminals to be connected to the adjacent semiconductor modules.

The following describes a power converter 1E according to the sixth embodiment of the present disclosure with reference to FIG. 25. The configuration and functions of the power converter 1E according to the sixth embodiment are mainly different from those of the power converter 1 according to the first embodiment by the following points. The following therefore mainly describes the different points.

The power converter 1E includes upper-arm semiconductor modules 2P and lower-arm semiconductor modules 2N. Each of the upper-arm semiconductor modules 2P for example incorporates therein an upper-arm semiconductor element, i.e. a switching element. Similarly, each of the lower-arm semiconductor modules 2N for example incorporates therein a lower-arm semiconductor element, i.e. a switching element.

For example, the upper-arm semiconductor elements and the lower-arm switching elements constitute the inverter circuit.

The upper-arm semiconductor modules 2P and the lower-arm semiconductor modules 2N are alternately arranged in the Y direction.

The first major surface 211 of the extending end 21A of each positive power terminal 21P is joined to the first busbar terminal 421 of the semiconductor-connection terminal 42 of the corresponding positive busbar 4P, and the second major surface 212 of the extending end 21A of each positive power terminal 21P is joined to the second busbar terminals 422 of the semiconductor-connection terminals 42 of the corresponding positive busbar 4P.

Additionally, the first major surface 211 of the extending end 21A of each negative power terminal 21N is joined to the first busbar terminal 421 of the semiconductor-connection terminal 42 of the corresponding negative busbar 4N, and the second major surface 212 of the extending end 21A of each negative power terminal 21N is joined to the second busbar terminals 422 of the semiconductor-connection terminals 42 of the corresponding negative busbar 4N.

The second busbar terminals 422 of one of the power terminals 21P and 21N and the first busbar terminal 421 of the other of the power terminals 21P and 21N adjacent to one of the power terminals 21P and 21N in the X direction are arranged to be non-overlapped with each other in the X direction. Specifically, the first busbar terminal 421 and the second busbar terminals 422 are shifted from each other in the Y direction.

This configuration of the power converter 1E enables a sufficient space to be ensured between the first busbar terminal 421 of the negative busbar 4N and the second busbar terminals 422, which are adjacent to the first busbar terminal 421 in the X direction, of the positive busbar 4P. This makes it possible to ensure sufficient electrical insulation between the first busbar terminal 421 of the negative busbar 4N and the second busbar terminals 422, which are adjacent to the first busbar terminal 421 in the X direction, of the positive busbar 4P.

The other operations and/or benefits obtained by the power converter 1E are substantially identical to the operations and/or obtained benefits obtained by the power converter 1.

The functions of one element in each embodiment can be distributed as plural elements, and the functions that plural elements have can be combined into one element. At least part of the structure of each embodiment can be replaced with a known structure having the same function as the at least part of the structure of the corresponding embodiment. A part of the structure of each embodiment can be eliminated. At least part of the structure of each embodiment can be added to or replaced with at least part of the structure of the other embodiment.

All aspects included in the technological ideas specified by the language employed by the claims constitute embodiments of the present invention.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alterations as would be appreciated by those having ordinary skill in the art based on the present disclosure. The limitations in the claims are to be interpreted broadly based on the language employed in the claims and not limited to examples described in the present specifica-

What is claimed is:

1. A power converter comprising:
a semiconductor module incorporating therein a semiconductor element constituting a power converter circuit, the semiconductor module having a power terminal extending therefrom, the power terminal having opposing first and second terminal surfaces;
a capacitor electrically connected to the semiconductor module; and
a busbar including:
opposing first and second ends;
a slit defined through one of the first and second ends, the slit comprising opposing first and second inner peripheral surfaces of the busbar;
a capacitor-connection terminal connected to the capacitor; and
at least first and second semiconductor-connection terminals that are at least partly joined to respective first and second terminal surfaces of the power terminal, the first and second semiconductor-connection terminals being located at respective first and second inner peripheral surfaces,
wherein the power terminal is located in the slit such that the first and second terminal surfaces of the power terminal face respective first and second semiconductor-connection terminals, and the first and second semiconductor-connection terminals are at least partly joined to the respective first and second terminal surfaces of the power terminal.

2. The power converter according to claim 1, wherein:
the first semiconductor-connection terminal includes a first busbar terminal joined to the first terminal surface of the power terminal; and
the second semiconductor-connection terminal includes a second busbar terminal joined to the second terminal surface of the power terminal.

3. The power converter according to claim 2, wherein:
the first and second busbar terminals joined to the power terminal are arranged to be non-overlapped with each other when viewed in a direction normal to the first and second terminal surfaces.

4. The power converter according to claim 2, wherein:
the first and second busbar terminals joined to the power terminal are arranged to be overlapped with each other when viewed in a direction normal to the first and second terminal surfaces.

5. The power converter according to claim 2, wherein:
each of the first and second busbar terminals comprises:
a base arranged to face the power terminal; and
a connector portion configured to continuously project from a bent portion along a corresponding one of the first and second terminal surfaces of the power terminal.

6. The power converter according to claim 5, wherein:
the connector portion of each of the first and second busbar is configured to extend toward the semiconductor module.

7. The power converter according to claim 5, wherein:
the connector portion of each of the first and second busbar is configured to extend toward a direction opposite to the semiconductor module.

8. The power converter according to claim 5, wherein:
each of the first and second busbar terminals comprises a bent portion continuously joining between the base and the connector portion; and
for each of the first and second busbar terminals:
the base, the connector portion, and the bent portion respectively have outer surfaces; and
the outer surface of the bent portion has a predetermined curvature to thereby smoothly join the outer surface of the base and the outer surface of the connector portion.

9. The power converter according to claim 1, wherein:
the first semiconductor-connection terminal includes at least two first busbar terminals joined to the first terminal surface of the power terminal; and
the second semiconductor-connection terminal includes at least one second busbar terminal joined to the second terminal surface of the power terminal.

10. The power converter according to claim 1, wherein:
the first semiconductor-connection terminal includes at least two first busbar terminals joined to the first terminal surface of the power terminal; and
the second semiconductor-connection terminal includes at least two second busbar terminals joined to the second terminal surface of the power terminal,
a number of the first busbar terminals being identical to a number of the second busbar terminals.

11. The power converter according to claim 1, wherein:
the semiconductor module comprises a plurality of semiconductor modules;
each of the semiconductor modules has, as the power terminal, a positive power terminal and a negative power terminal extending therefrom in a predetermined direction;
the semiconductor modules are arranged in the normal direction to the first and second terminal surfaces; and
the positive power terminals of the semiconductor modules and the negative power terminals of the semiconductor modules are shifted relative to each other in a direction perpendicular to the predetermined direction and an arrangement direction of the semiconductor modules.

12. The power converter according to claim 11, wherein:
the busbar comprises a positive busbar and a negative busbar, each of the positive and negative busbars including the capacitor-connection terminal connected to a corresponding one of positive and negative electrodes of the capacitor; and
a selected one of the first and second semiconductor-connection terminals is at least partly joined to respective first and second terminal surfaces of the positive power terminal and a selected one of the first and second semiconductor-connection terminals is at least partly joined to respective first and second terminal surfaces of the negative power terminal are shifted to each other in a direction normal to the first and second terminal surfaces.

13. The power converter according to claim 1, wherein:
the semiconductor module comprises a plurality of first and second semiconductor modules arranged in the normal direction to the first and second terminal surfaces;
the busbar comprises a positive busbar and a negative busbar, each of the positive and negative busbars including the capacitor-connection terminal connected to a corresponding one of positive and negative electrodes of the capacitor;
the first and second semiconductor-connection terminals of the positive busbar are at least partly joined to respective first and second surfaces of the power terminal of each of the first semiconductor modules;

the first and second semiconductor-connection terminals of the negative busbar are at least partly joined to respective first and second surfaces of the power terminal of each of the second semiconductor modules; and one of the first and second semiconductor-connection terminals of the positive busbar and one of the first and second semiconductor-connection terminals of the negative busbar, which are closer to each other, are arranged to be non-overlapped with each other in an arrangement direction of the first and second semiconductor modules.

14. The power converter according to claim 1, wherein:

the semiconductor module comprises a plurality of semiconductor modules arranged in a predetermined direction;

the busbar comprises plural sets of first and second semiconductor-connection terminals for the power terminals of respective semiconductor modules;

the capacitor-connection terminal and the first and second semiconductor-connection terminals of the busbar are arranged to be opposite to each other in a direction perpendicular to an extending direction of the power terminal and an arrangement direction of the semiconductor modules;

one of the first and second semiconductor-connection terminals of each set is located to be the closest to the capacitor-connection terminal, the one of the first and second semiconductor-connection terminals of each set located to be the closest to the capacitor-connection terminal will be referred to as a closest semiconductor-connection terminal; and the closest semiconductor-connection terminals of respective sets are aligned with each other in the arrangement direction of the semiconductor modules.

15. A power converter comprising:

a semiconductor module incorporating therein a semiconductor element constituting a power converter circuit, the semiconductor module having a power terminal extending therefrom, the power terminal having opposing first and second terminal surfaces; and a busbar including:

a slit defined therethrough such that the power terminal is located in the slit, the slit comprising opposing first and second inner peripheral surfaces of the busbar; and at least first and second semiconductor-connection terminals that are at least partly joined to respective first and second terminal surfaces of the power terminal located in the slit, wherein the first semiconductor-connection terminal includes a first busbar terminal located at one of the first and second inner peripheral surfaces and joined to the first terminal surface of the power terminal located in the slit, and the second semiconductor-connection terminal includes a second busbar terminal located at the other of the first and second inner peripheral surfaces and joined to the second terminal surface of the power terminal and located in the slit.

* * * * *